US010111356B2

(12) United States Patent
Lindquist et al.

(10) Patent No.: US 10,111,356 B2
(45) Date of Patent: Oct. 23, 2018

(54) SYSTEM FOR ELECTRICAL CONNECTION OF PRINTED CIRCUIT BOARDS AND BACKPLANES IN SERVER ENCLOSURE

(71) Applicant: Oracle International Corporation, Redwood City, CA (US)

(72) Inventors: Stephen Lindquist, Boylston, MA (US); William Izzicupo, Bedford, NH (US); Lyne Dore, Chelmsford, MA (US); Todd Ellsworth, Ashburnham, MA (US); Daniela Buchman, Mountain View, CA (US)

(73) Assignee: Oracle International Corporation, Redwood City, CA (US)

( * ) Notice: Subject to any disclaimer, the term of this patent is extended or adjusted under 35 U.S.C. 154(b) by 177 days.

(21) Appl. No.: 15/086,386

(22) Filed: Mar. 31, 2016

(65) Prior Publication Data

US 2017/0290190 A1    Oct. 5, 2017

(51) Int. Cl.
*H05K 7/14*    (2006.01)
*H05K 13/00*    (2006.01)

(52) U.S. Cl.
CPC ......... *H05K 7/1489* (2013.01); *H05K 7/1417* (2013.01); *H05K 7/1439* (2013.01); *H05K 7/1485* (2013.01); *H05K 7/1487* (2013.01); *H05K 7/1492* (2013.01); *H05K 13/00* (2013.01)

(58) Field of Classification Search
CPC .. H05K 7/1489; H05K 7/1487; H05K 7/1417; H05K 7/1439; H05K 13/0023; H05K 13/00; H05K 7/1485; H05K 7/1492
See application file for complete search history.

(56) References Cited

U.S. PATENT DOCUMENTS

| 3,640,399 | A | * | 2/1972 | Hartman | A47B 45/00 211/175 |
| 6,362,968 | B1 | | 3/2002 | Lajara | |
| 6,833,994 | B2 | | 12/2004 | Yair et al. | |
| 7,364,447 | B1 | * | 4/2008 | Desrosiers | G06F 1/186 439/157 |
| 8,902,601 | B2 | * | 12/2014 | Trotman | H05K 7/1402 361/679.38 |
| 9,069,522 | B2 | * | 6/2015 | Ho | G06F 1/16 |
| 9,877,405 | B2 | * | 1/2018 | Sato | H05K 7/1418 |
| 2007/0279884 | A1 | * | 12/2007 | Hardt | H05K 7/1487 361/796 |
| 2008/0212273 | A1 | | 9/2008 | Bechtolsheim et al. | |

(Continued)

*Primary Examiner* — Hoa C Nguyen
*Assistant Examiner* — Christopher L Augustin
(74) *Attorney, Agent, or Firm* — Marsh Fischmann & Breyfogle LLP; Jonathon A. Szumny

(57) ABSTRACT

Utilities (e.g., apparatuses, systems, methods, etc.) for reducing or eliminating gaps between the tips of male pins and the bottoms of corresponding female sockets of interfaced connectors (e.g., daughtercard and backplane connectors) of a computing module and a backplane of a server enclosure under a variety of differing mechanical tolerances in the lengths of the server enclosure and the computing module (e.g., along a dimension that is parallel to the longitudinal axes of the male pins and female sockets). The disclosed utilities allow for increased signal quality and data rates through interfaced connectors while reducing strain on the PCB, solder joints, and the like during the interfacing of the connectors.

11 Claims, 22 Drawing Sheets

(56) References Cited

U.S. PATENT DOCUMENTS

| | | | |
|---|---|---|---|
| 2008/0259555 A1 | 10/2008 | Bechtolsheim et al. | |
| 2011/0009648 A1 | 1/2011 | Albert et al. | |
| 2013/0258587 A1 | 10/2013 | Li | |
| 2013/0265695 A1 | 10/2013 | Canfield | |
| 2014/0160652 A1* | 6/2014 | Cai | G06F 1/188 361/679.02 |
| 2014/0353264 A1* | 12/2014 | Venugopal | H05K 7/1487 211/41.17 |
| 2015/0077920 A1* | 3/2015 | Zhu | H05K 7/1487 361/679.31 |
| 2015/0103492 A1* | 4/2015 | Wu | G06F 1/185 361/726 |
| 2016/0128222 A1* | 5/2016 | Hsiao | H05K 7/142 361/679.02 |
| 2016/0360636 A1* | 12/2016 | Magnoux | H05K 7/1411 |
| 2017/0045921 A1* | 2/2017 | Norton | H05K 7/1487 |
| 2017/0181309 A1* | 6/2017 | Yi | H05K 7/1417 |

\* cited by examiner

SYSTEM FOR ELECTRICAL CONNECTION OF PRINTED CIRCUIT BOARDS AND BACKPLANES IN SERVER ENCLOSURE

BACKGROUND

1. Field of the Invention

The present invention generally relates to computing devices such as servers and, more particularly, to the electrical connection of printed circuit boards of a server with a backplane of the server.

2. Relevant Background

As generally referred to in the art, a server is a computing device that is configured to perform operations for one or more other computing devices connected over a network. For an entity that requires computing infrastructure for handling relatively large amounts of network data, it is desirable to use servers that are designed to promote organizational/space efficiency and operational performance. In this regard, some servers are designed to be arranged in a rack (e.g., cabinet), where the rack may house numerous servers that are slidably received into respective bays of the rack via pairs of rail members.

One type of server includes an enclosure (e.g., housing) having a number of bays or sockets for slidably receiving a number of modules (e.g., blades, field replaceable units (FRUs), etc.). For instance, each module may generally include a chassis (e.g., tray) containing a printed circuit board ("PCB," e.g., daughtercard) that includes any appropriate arrangement of processors, memory, storage, network connections, and the like. One or more connectors (e.g., daughtercard connectors) that are electrically connected to the PCB of each module may be configured to electrically interface (e.g., mate) with one or more corresponding connectors of a backplane (e.g., or midplane) of the server enclosure as the module is inserted into a socket of the chassis. The backplane (e.g., which may include or be associated with any appropriate system controller or manager) may provide non-core computing services to installed modules such as power, cooling, interconnects, management, and the like.

SUMMARY

The server enclosure and modules inserted therein have various mechanical tolerances. In the case of the server enclosure, there may be a mechanical tolerance in the distance from the front of the server enclosure (e.g., adjacent to where a handle of a module interconnects) to the backplane connectors. In the case of the module, there may be a mechanical tolerance in the distance from the front of the module (e.g., adjacent to the handle) to the rear of the modules adjacent the daughtercard connectors. These mechanical tolerances are typically taken up by allowing for variable "wipe" or variation in the length or degree of overlap of the contacts of each respective pair of backplane and daughtercard connectors. Specifically, one of the daughtercard and backplane connectors includes a plurality of male pins while the other of the daughtercard and backplane connectors includes a corresponding plurality of female sockets that are configured to receive the plurality of male pins when the two connectors are interfaced. Thus, the above mechanical tolerances of the server enclosure and modules inserted therein are sometimes taken up by allowing the tip of each male pin to not necessarily need to sit at the bottom of the corresponding female socket. However, the resulting gap between the tip of the male pin and the bottom of the female socket allows the pin to serve as a resonator and degrade the signal propagation thus causing unacceptable signal degradation, especially at high data rates.

In this regard, disclosed herein are utilities (e.g., apparatuses, systems, methods, etc.) that are configured to reduce or eliminate such gaps (e.g., so that this is substantially a "zero" gap) between the tips of male pins and the bottoms of corresponding female sockets in daughtercard and backplane connectors in a wide variety of mating conditions to allow the connectors to provide higher signal quality at higher data rates. In the case where the length between the front of the server enclosure and the backplane is at its longest (e.g., length plus its tolerance) and the length of the module from its front to its rear is at its shortest (e.g., length minus its tolerance), the disclosed utilities are configured to provide an insertion force against the PCB towards the backplane so that the tips of the male pins just interface with the bottoms of the female sockets of the daughtercard and backplane connectors (e.g., with substantially zero gap between the male pin tips and female socket bottoms). In the case where the length between the front of the server enclosure and the backplane is at its shortest (e.g., length minus its tolerance) and the length of the module from its front to its rear is at its longest (e.g., length plus its tolerance), the disclosed utilities are configured to allow the PCB of the module to slide away from the backplane to prevent or limit damage to the backplane, solder joints, and the like due to the "extra" length of the module while still maintaining substantially zero gap between the male pin tips and female socket bottoms.

As will be discussed, the daughtercard (or other PCB to which the corresponding daughtercard connectors are secured) of a module for insertion into a server enclosure may be slidably mounted relative to the module chassis along a direction or axis of travel (where the direction of travel is parallel to the longitudinal axes of the male pins and the female sockets of the connectors) by way of a sliding support frame that is slidable over a bottom of the chassis. The daughtercard and connectors may be secured over or to the sliding frame in any appropriate manner (e.g., so as to be non-movable relative to the sliding frame).

Initially, the rear portion of the module may be inserted into a corresponding socket of the server enclosure towards the backplane and any appropriate lever handle(s) movably secured to the front portion of the module chassis may contact a corresponding portion of the server chassis and be pivoted or otherwise moved into a closed position to drive the daughtercard connectors into engagement with the backplane connectors. In the event closing of the handle(s) would otherwise leave the tips of the male pins short of the bottom of the female sockets of the connectors, a biasing apparatus interconnected between the module and the sliding frame is configured generate an insertion force that overcomes any friction between the daughtercard and backplane connectors and thus urges the sliding frame and thus the daughtercard connectors in a first direction relative to the module chassis further towards the backplane so that the male pins just rest against the bottom of the female sockets of the connectors (e.g., substantially free of excess strain on solder joints, the backplane, etc.).

In the event closing of the handle(s) drives the tips of the male pins forcibly against the bottoms of the female sockets (or vice versa) of the connectors to an amount that would otherwise cause damage to the module or server (e.g., to solder joints, daughtercard, backplane, etc.), the biasing apparatus allows the sliding frame and thus the daughtercard connectors to move in an opposite second direction relative to the module chassis towards the front portion of the chassis so that the male pins just rest against the bottom of the female sockets of the connectors (e.g., substantially free of excess strain on solder joints, the backplane, etc.). Stated differently, the biasing apparatus is configured to reduce the force in the system by deflecting and allowing the sliding frame to slide relative to the chassis rather than overstressing and damaging the backplane and the daughtercard due to mechanical interference.

In one aspect disclosed herein, a module for slidable receipt in an electronics enclosure includes a chassis including opposite front and rear portions, opposite first and second side portions, and an interior portion; a PCB mounted within the interior portion of the chassis for sliding movement along an axis that extends from the front portion to the rear portion between the first and second side portions of the chassis; at least a first connector electrically connected to the PCB adjacent the rear portion of the chassis; and a biasing apparatus interconnected between the chassis and the PCB that is configured to deflect upon engagement between the first connector and a corresponding second connector secured within the electronics enclosure as the chassis is inserted into a socket of the electronics enclosure.

In one embodiment, the chassis may further include a bottom portion, where the PCB is slidable over the bottom portion of the chassis along the axis. The module may also further include a frame that is slidably attached to the bottom portion of the chassis for sliding movement along the axis, where the PCB is rigidly attached to the frame for movement therewith along the axis. For instance, the biasing apparatus may have a spring constant less than that of the frame. In one arrangement, one of the frame and the chassis may include a plurality of protrusions and the other of the frame and the chassis includes a plurality of slots that configured to receive the plurality of protrusions to guide sliding of the frame and PCB along the axis.

In another aspect disclosed herein, a server includes an enclosure including a housing and an interior space within the housing, wherein the interior space defines a plurality of sockets; a backplane secured to the housing within the interior space adjacent a rear portion of the plurality of sockets, where the backplane includes at least one backplane connector adjacent the rear portion of each socket of the plurality of sockets; and a computing module receivable in a first socket of the plurality of sockets. The computing module includes a chassis that is slidable within the first socket along a first axis; a PCB that is slidable relative to the chassis along a second axis that is collinear with or parallel to the first axis; and a PCB connector attached to the PCB for electrical connection with the backplane connector of the first socket.

In a further aspect disclosed herein, a method includes inserting a chassis of a computing module into a socket of an enclosure; establishing, during the inserting, contact between a first electrical connector of the chassis and a second electrical connector adjacent a rear of the socket in the enclosure; and allowing the first electrical connector to slide relative to the chassis during the establishing.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

DETAILED DESCRIPTION

Figure 1:
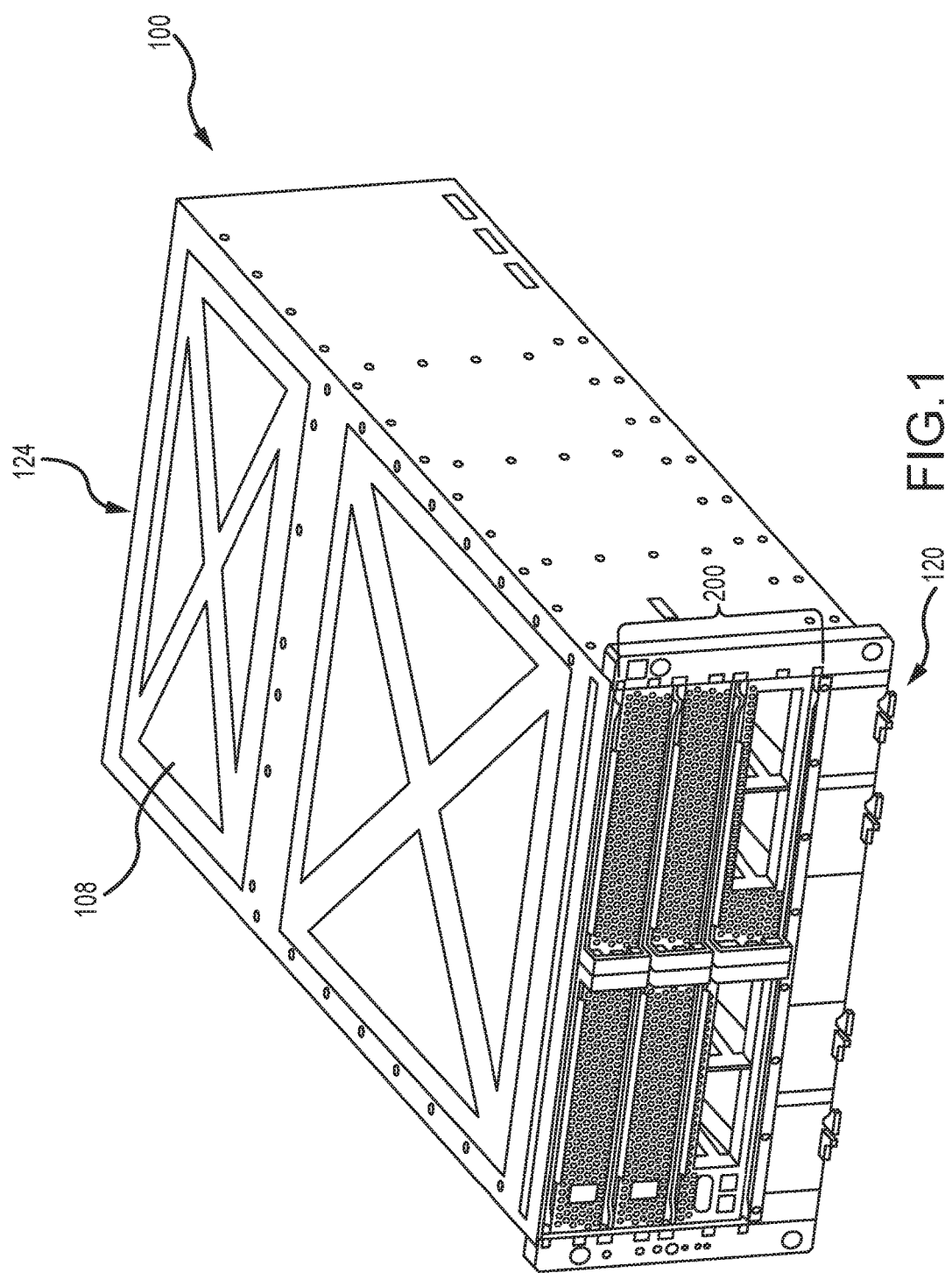
FIG. 1 is a perspective view of a server including a number of computing modules inserted into sockets of an enclosure according to one embodiment.

Disclosed herein are utilities (e.g., apparatuses, systems, methods, etc.) for reducing or eliminating gaps between the tips of male pins and the bottoms of corresponding female sockets of interfaced connectors (e.g., daughtercard and backplane connectors) of a computing module and a backplane of a server enclosure under a variety of differing mechanical tolerances in the lengths of the server enclosure and the computing module (e.g., along a dimension that is parallel to the longitudinal axes of the male pins and female sockets). The disclosed utilities allow for increased signal quality and data rates through interfaced connectors while reducing strain on the PCB, solder joints, and the like during the interfacing of the connectors.

Turning initially to FIGS. 1-4, various views of a server 100 that is configured to incorporate the connector gap-reducing utilities disclosed herein according to one embodiment are illustrated. The server 100 generally includes a server enclosure 104 (e.g., electronics enclosure) including a housing 108 (e.g., chassis) having an interior space 112 that defines a plurality of sockets 116 for receiving a respective plurality of computing modules 200. The housing 108 of the server enclosure 104 generally includes a front portion 120 and an opposite rear portion 124, where each computing module 200 is configured to be initially received into one of the sockets 116 via the front portion 120 of the housing 108. Thereafter, the computing module 200 may be slid within the socket 116 towards the rear portion 124 of the housing until the computing module 200 electrically interfaces with a backplane 300 of the server 100 that is mounted within the interior space 112 adjacent the rear portion 124.

Figure 3:
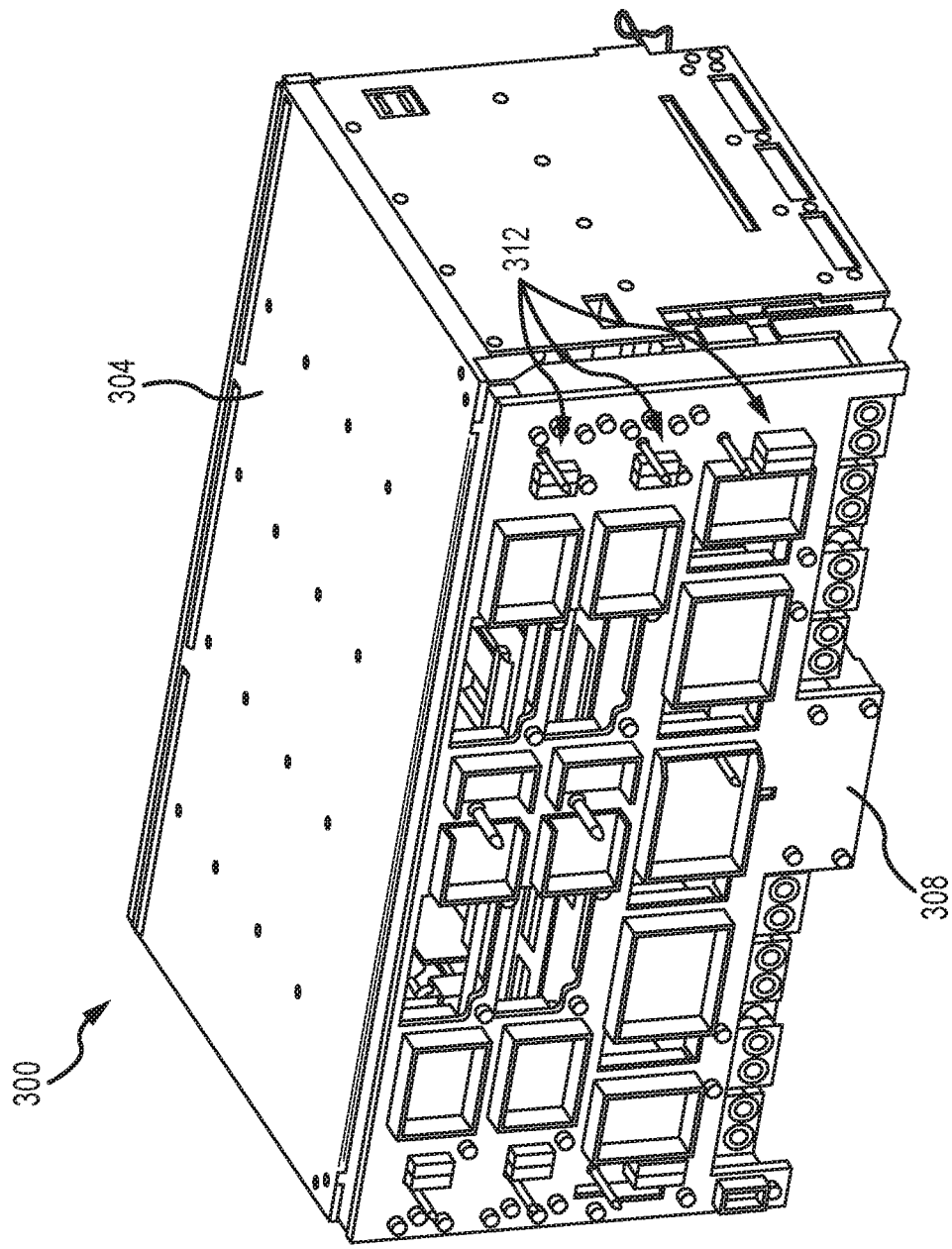
FIG. 3 is a perspective view of a backplane of the server enclosure of FIG. 1.
Figure 4:
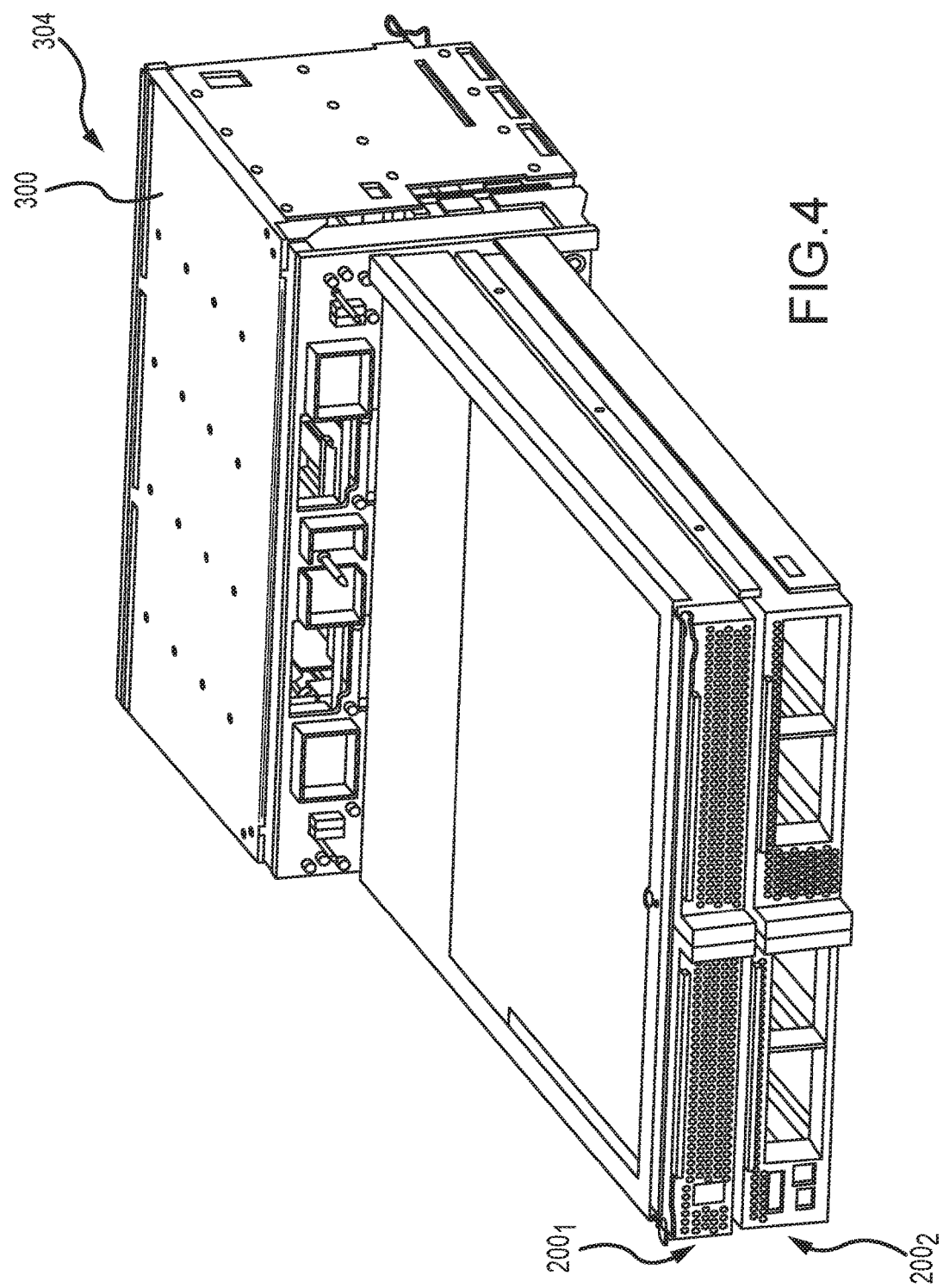
FIG. 4 is a perspective view of the backplane of FIG. 3 including first and second computing modules interfaced therewith.
Figure 5:
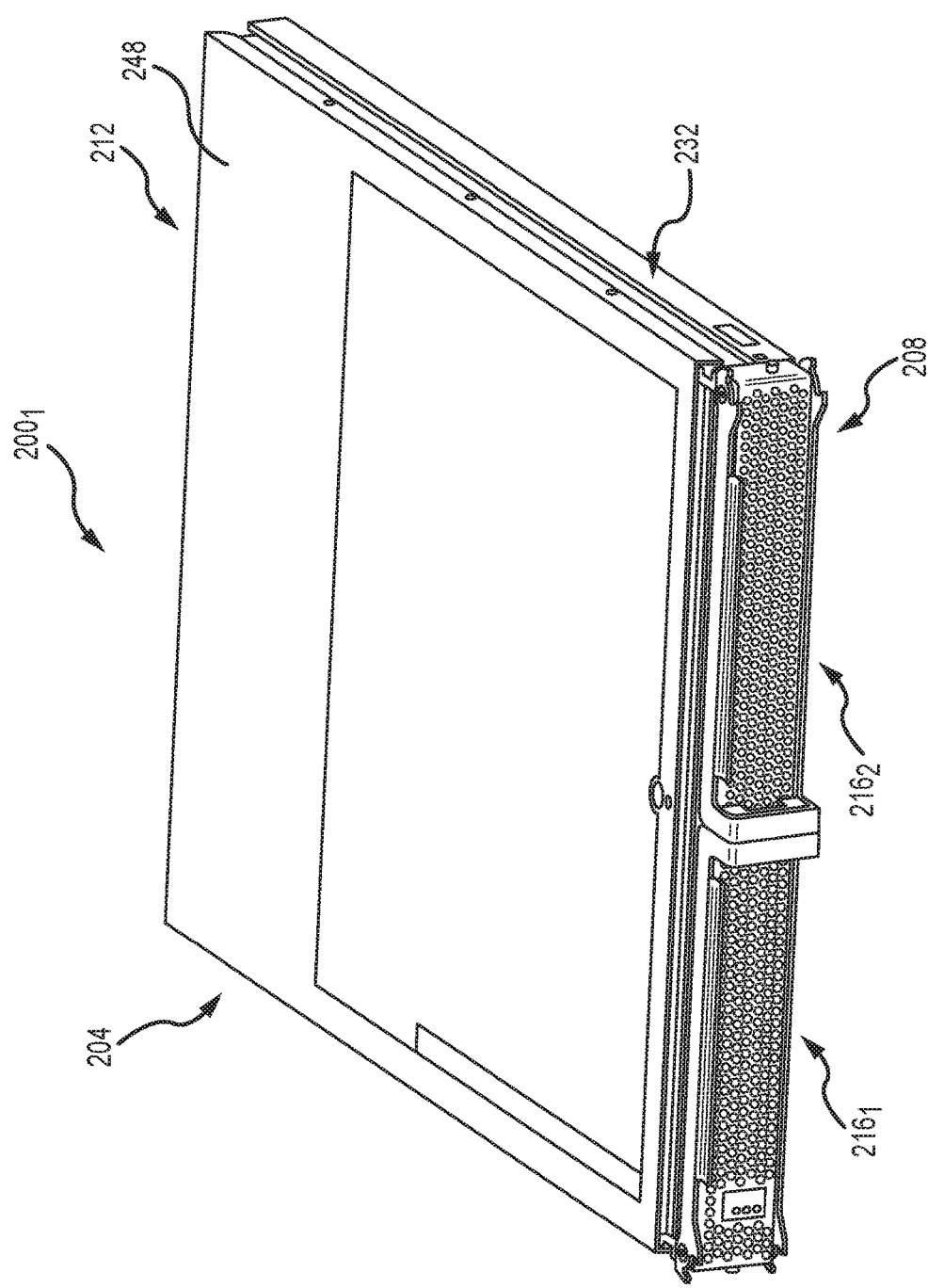
FIG. 5 is a front perspective view of the first computing module of FIG. 4.
Figure 6:
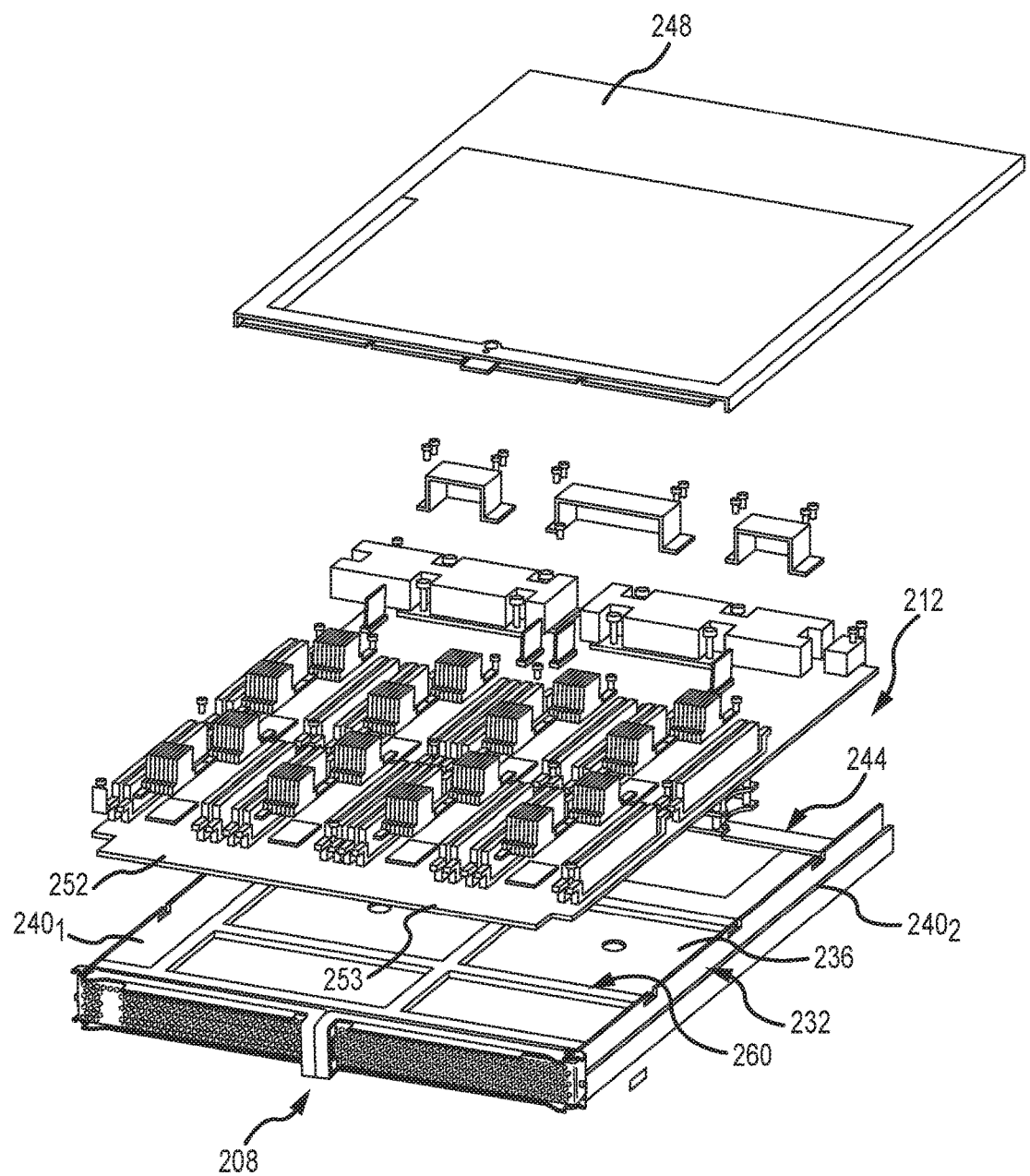
FIG. 6 is an exploded front perspective view of the first computing module of FIG. 4.
Figure 7:
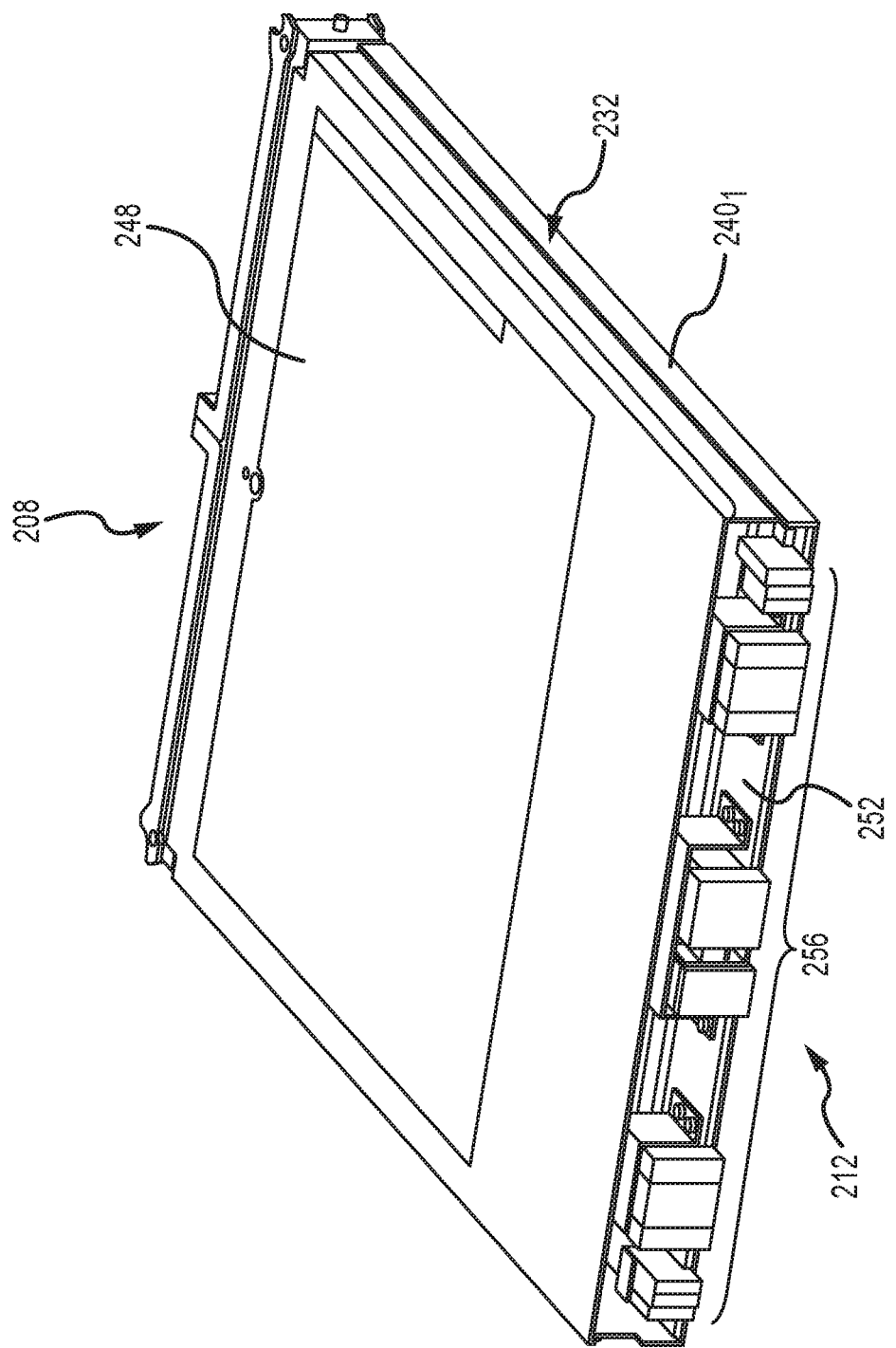
FIG. 7 is a rear perspective view of the first computing module of FIG. 4.
Figure 8:
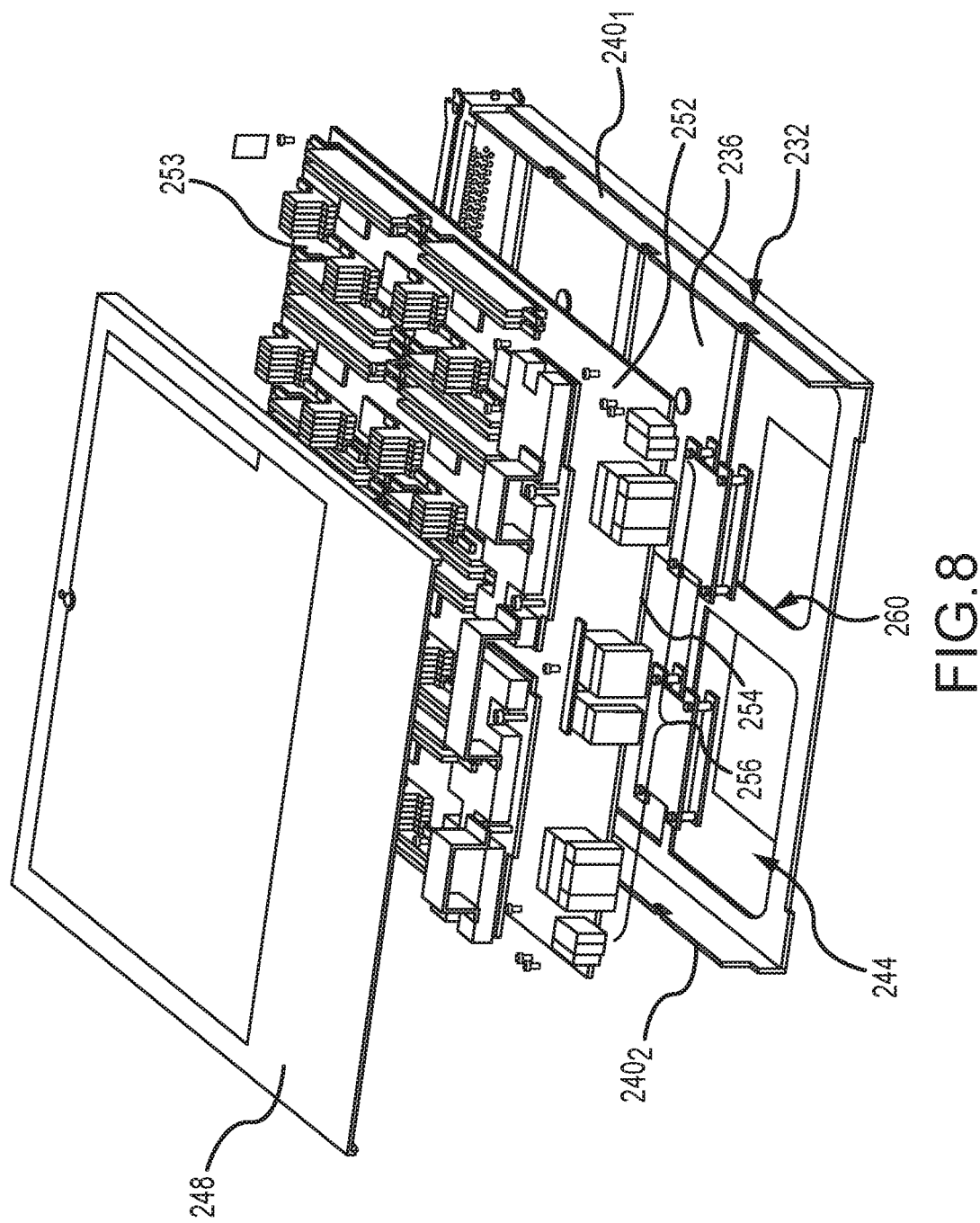
FIG. 8 is an exploded rear perspective view of the first computing module of FIG. 4.

With reference to FIG. 3, the backplane 300 may include a chassis 304 (e.g., housing) and a PCB 308 attached to the chassis 304 that includes any appropriate number and type of connectors 312 that are configured to be electrically interfaced with corresponding connectors of the computing modules 200. For instance, a plurality of rows of connectors 312 may be appropriately arranged along the PCB 308, where each row of connectors 312 is configured to be situated adjacent a rear portion of a respective one of the sockets 116 when the backplane 300 is appropriately mounted within the housing 108 of the server enclosure 104. The backplane 300 is thus broadly configured to serve as a computing bus that appropriately interconnects the computing modules 200 to each other, to other networks, and the like.

Figure 2:
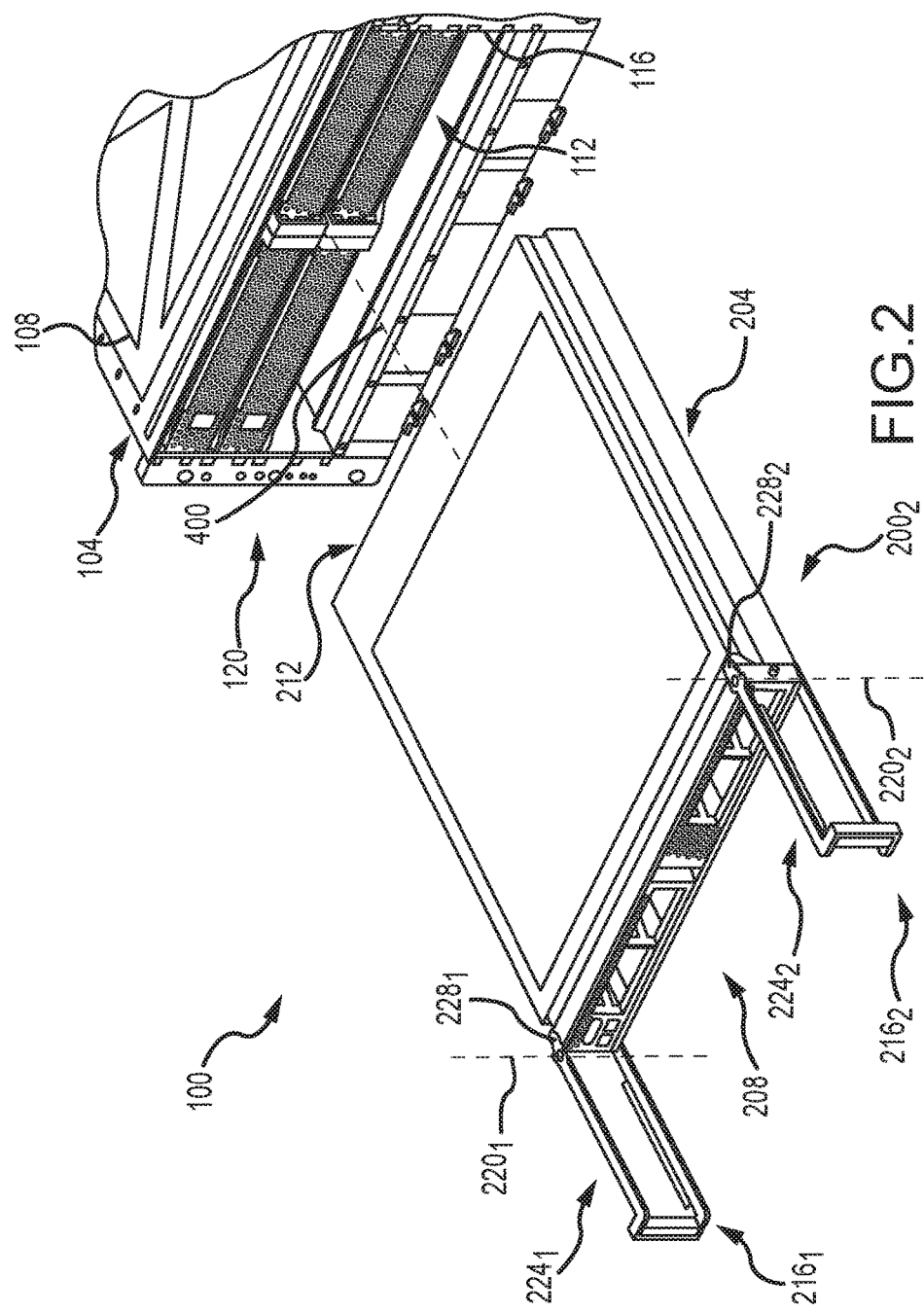
FIG. 2 is a perspective view of the server of FIG. 1 with one of the computing modules being removed from its socket of the enclosure.

Each computing module 200 broadly includes a chassis 204 (e.g., housing) including opposite front and rear portions 208, 212 and containing any appropriate arrangement of processors, memory, storage, and the like that are collectively configured to handle any appropriate number and type of workloads such as database, applications, and the like. The chassis 204 may have a form factor that allows the chassis 204 to be slidably received along an axis 400 into one of the sockets 116 of the server enclosure 104. The axis 400 of each socket 116 may generally extend from the front portion 120 of the housing to the rear portion 124 of the housing. With reference to FIG. 2, each computing module 200 may also include any appropriate insertion force generation apparatus configured to provide a particular amount of force along or parallel to the axis 400 for electrically interfacing connectors adjacent the rear of the chassis 204 and the corresponding connectors 312 on the backplane 300 (e.g., by way of overcoming friction forces between the respective pairs of connectors).

For instance, the insertion force generation apparatus may be in the form of first and second levers $216_1$, $216_2$ that are attached to the chassis 204 for pivotal movement about respective pivot axes $220_1$, $220_2$ adjacent opposite sides of the front portion 208 between open positions (e.g., as shown in FIG. 2) and closed positions (e.g., as shown in FIG. 1). A user may initially insert the rear portion 212 of the chassis 204 of a computing module 200 into a particular socket 116 of the server enclosure 104 (with the levers 216 in their open positions) and continue insertion of the chassis 204 along the axis 400 until initial resistance between the connectors adjacent the rear of the chassis 204 and the connectors 312 of the backplane 300 is encountered (which corresponds with the levers 216 and the front portion 208 of the chassis generally aligning with the front portion 120 of the server enclosure 104). As the user thereafter pushes handle portions $224_1$, $224_2$ of each lever $216_1$, $216_2$ about the respective pivot axes $220_1$, $220_2$, catch portions $228_1$, $228_2$ of each lever $216_1$, $216_2$ catch on corresponding portions of the housing 108 of the server enclosure 104 which drives the chassis 204 further along the axis 400 (e.g., so that the connectors of the computing module 200 and the connectors 312 of the backplane 300 further engage with each other) as the user pushes the handle portions $224_1$, $224_2$ into their closed positions.

FIGS. 5-8 present various views of a first computing module $200_1$ of the number of computing modules 200 of the server 100. The chassis 204 may include a base member 232 (e.g., tray) having a base surface 236 as well as first and second opposite walls $240_1$, $240_2$ extending upwardly away from the base surface 236. The chassis 204 may also include a cover member 248 that is configured to be disposed over the first and second opposite walls $240_1$, $240_2$ across the base surface 236 of the base member 232. The base surface 236 and first and second opposite walls $240_1$, $240_2$ (and cover member 248 if included) generally define an interior portion 244 of the chassis 204 for containing a PCB 252 (e.g., daughtercard). The PCB 252 generally includes a front portion 253 that is configured to be disposed adjacent the front portion 208 of the chassis 204, an opposite rear portion 254 that is configured to be disposed adjacent the rear portion 212 of the chassis 204, and any appropriate arrangement of electrical components (e.g., processors, memory, controllers, etc. interconnected by conductive traces). A plurality of connectors 256 are electrically connected to the conductive traces of the PCB 252 adjacent the rear portion 252 of the PCB 252 for electrical interfacing (e.g., mating) with the corresponding plurality of connectors 312 of the backplane 300 adjacent the rear portion of a particular one of the sockets 116 of the server enclosure 104.

The PCBs (and thus connectors) attached thereto of computing modules of existing servers are typically rigidly or otherwise non-movably attached to the chassis of the computing modules. Using FIG. 8 as an example, the PCB 252 would be rigidly attached to or relative to the base surface 236 of the chassis 204 in such that the PCB 252 and connectors 256 would not be able to move relative to the chassis 204. However, such an arrangement would limit the ability of the connectors 256 of the PCB 252 to be able to fully mate with the connectors 312 of the backplane 300 (e.g., so that the ends or tips of the male pins of one of the connectors 256, 312 rest flush with the bottoms of the female sockets of the other of the connectors 256, 312) under a wide range of mechanical tolerances in the lengths of the chassis 204 (the distance between the front and rear portions 208, 212) and the socket 116 (the distance between the front portion 120 of the housing 108 and the connectors 312 of the backplane 300) free of bending of the PCBs 252, 308, damage to solder joints, and the like.

In this regard, the PCB 252 and connectors 256 of the computing module $200_1$ are movably attached to the base member 232 of the chassis 204 so that the PCB 252 and connectors 256 can move relative to the chassis 204 as the connectors 256 are being interfaced with the connectors 312 of the backplane to allow the connectors 256 of the PCB 252 to be able to fully mate with the connectors 312 of the backplane 300 (for increased signal quality and data rates through the connectors 256, 312) under a wide range of mechanical tolerances in the lengths of the chassis 204 and the socket 116 within which the chassis 204 is received substantially free of bending of the PCBs 252, 308, damage to solder joints, and the like. More specifically, the PCB 252 is mounted to or over the base surface 236 of the chassis 204 for sliding movement along or relative to an axis 272 that is parallel to the axis 400 along which the chassis 204 slides as it is being inserted into the socket 116 of the server enclosure 104. Furthermore, at least one biasing apparatus 500 interconnects the PCB 252 to the chassis 204 for applying a force against the PCB 252 in a first direction along the axis 272 away from the front portion 208 of the chassis so that the connectors 256 can substantially fully mate with the corresponding connectors 312 of the backplane 300 (e.g., male pins seated at bottom of female sockets). The at least one biasing apparatus 500 is also configured to receive a reaction force from the backplane connectors 312 that allows the PCB 252 to move in an opposite second direction along the axis 272 towards the front portion 208 while maintaining substantially full mating of the connectors 256, 312 (e.g., in the event the particular lengths of the chassis 204 and enclosure socket 116 would otherwise result in damage to the PCBs 252, 308, solder joints, etc. upon closing of the levers 116).

Figure 9:
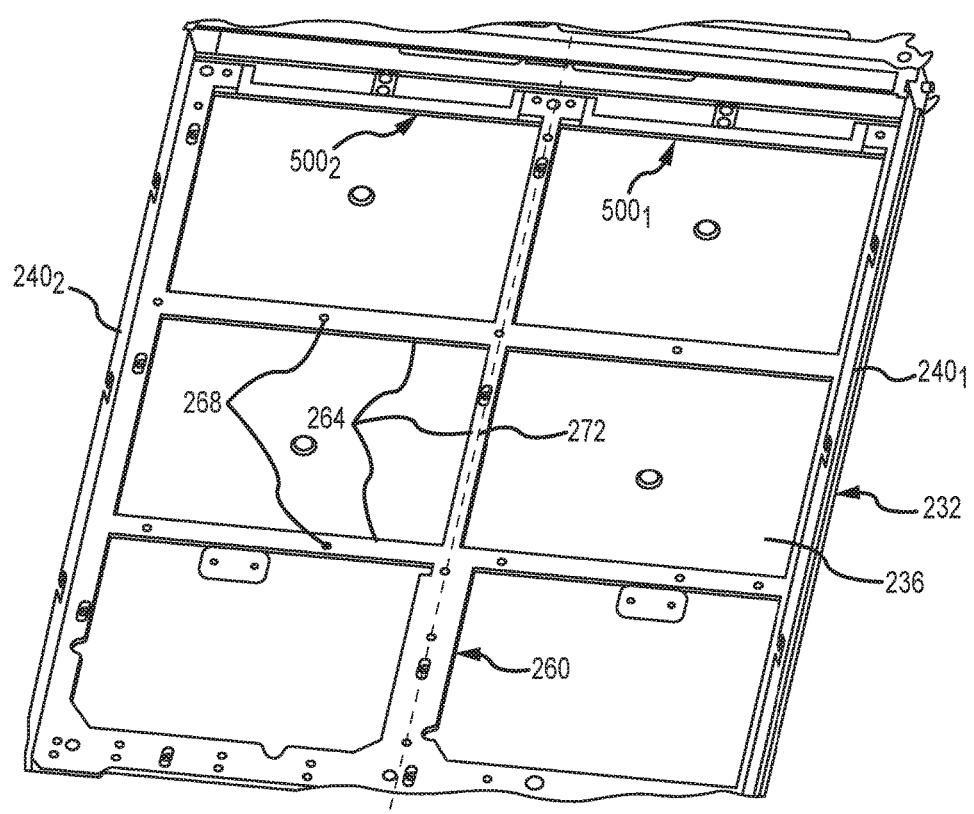
FIG. 9 is a rear perspective view of the first computing module of FIG. 4 with a top cover and PCB being removed to illustrate a sliding frame and biasing apparatus.
Figure 10:
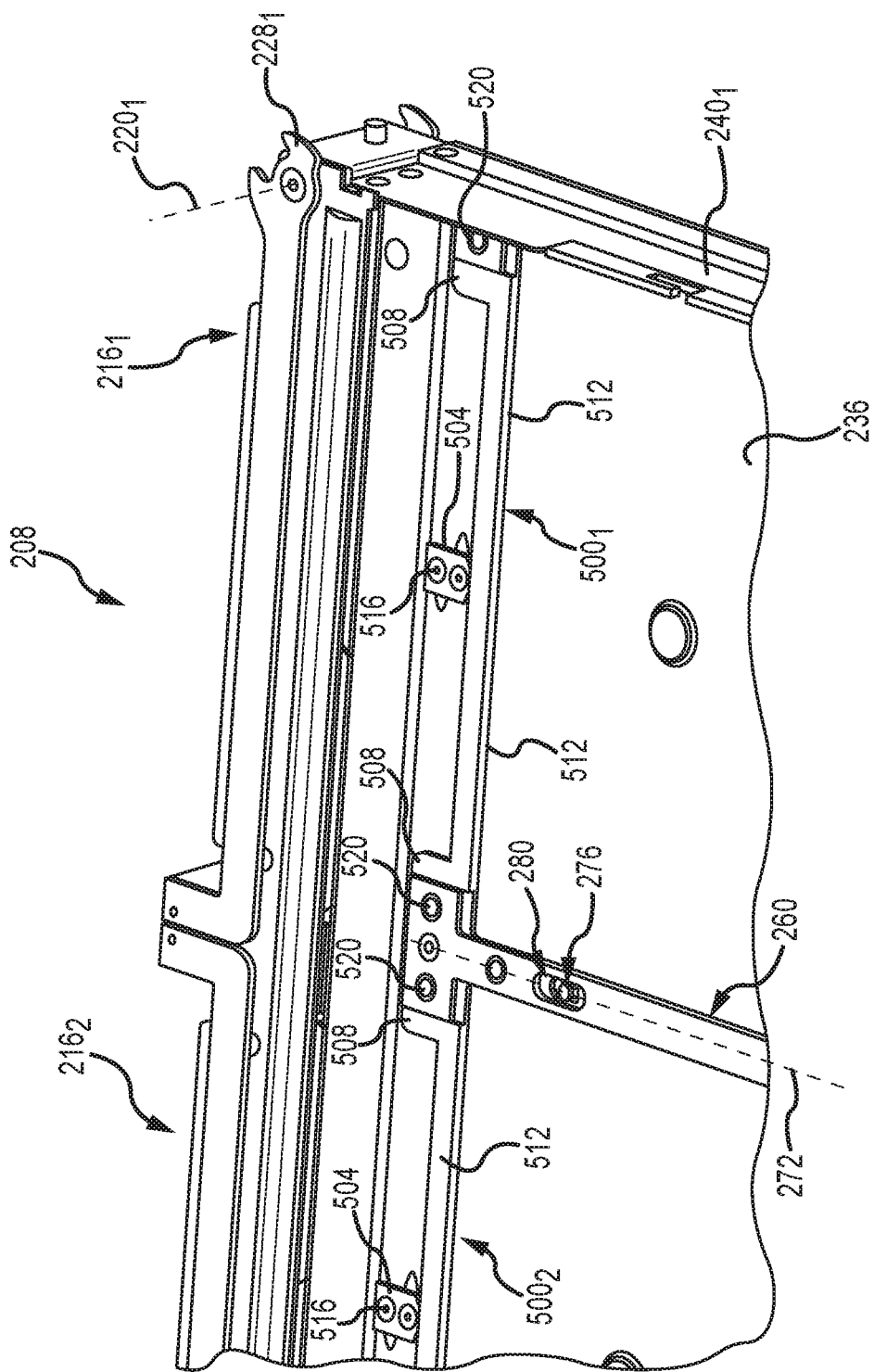
FIG. 10 is a close-up perspective view of the sliding frame and biasing apparatus of FIG. 9.
Figure 11:
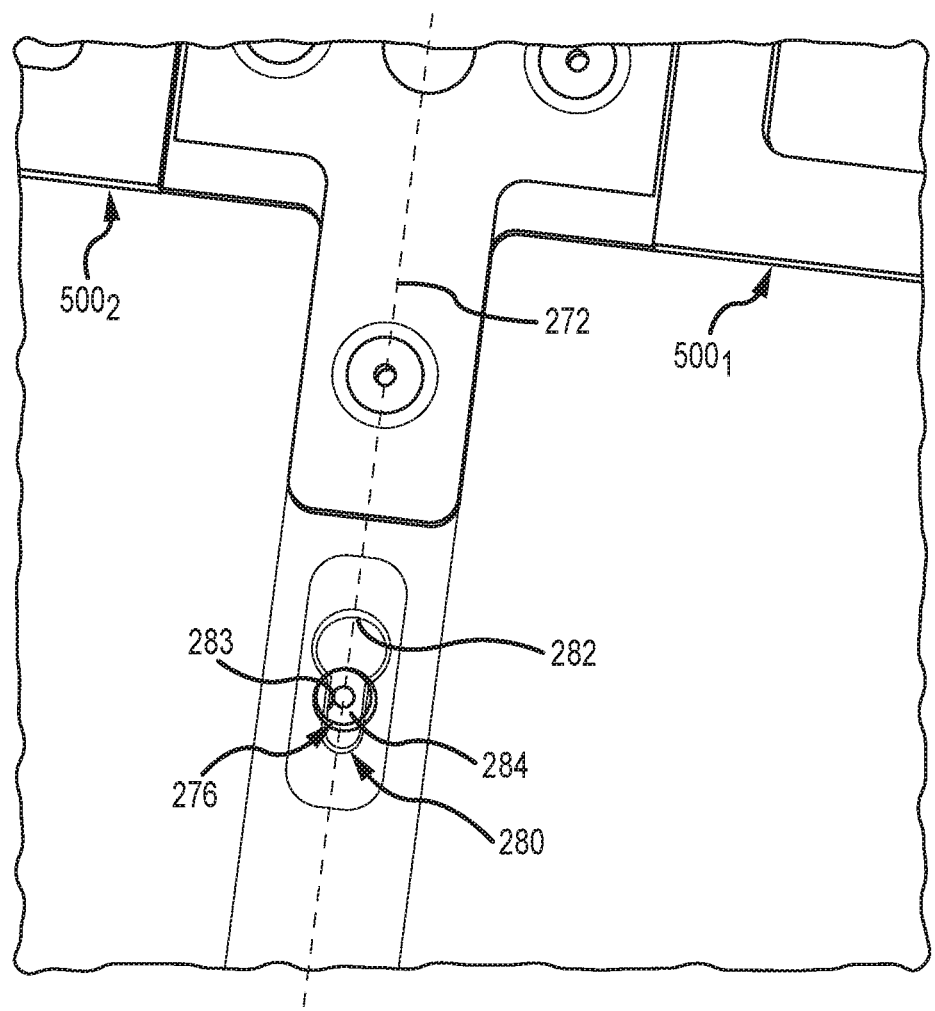
FIG. 11 is a close-up perspective view of a portion of the sliding frame of FIG. 10.
Figure 12:
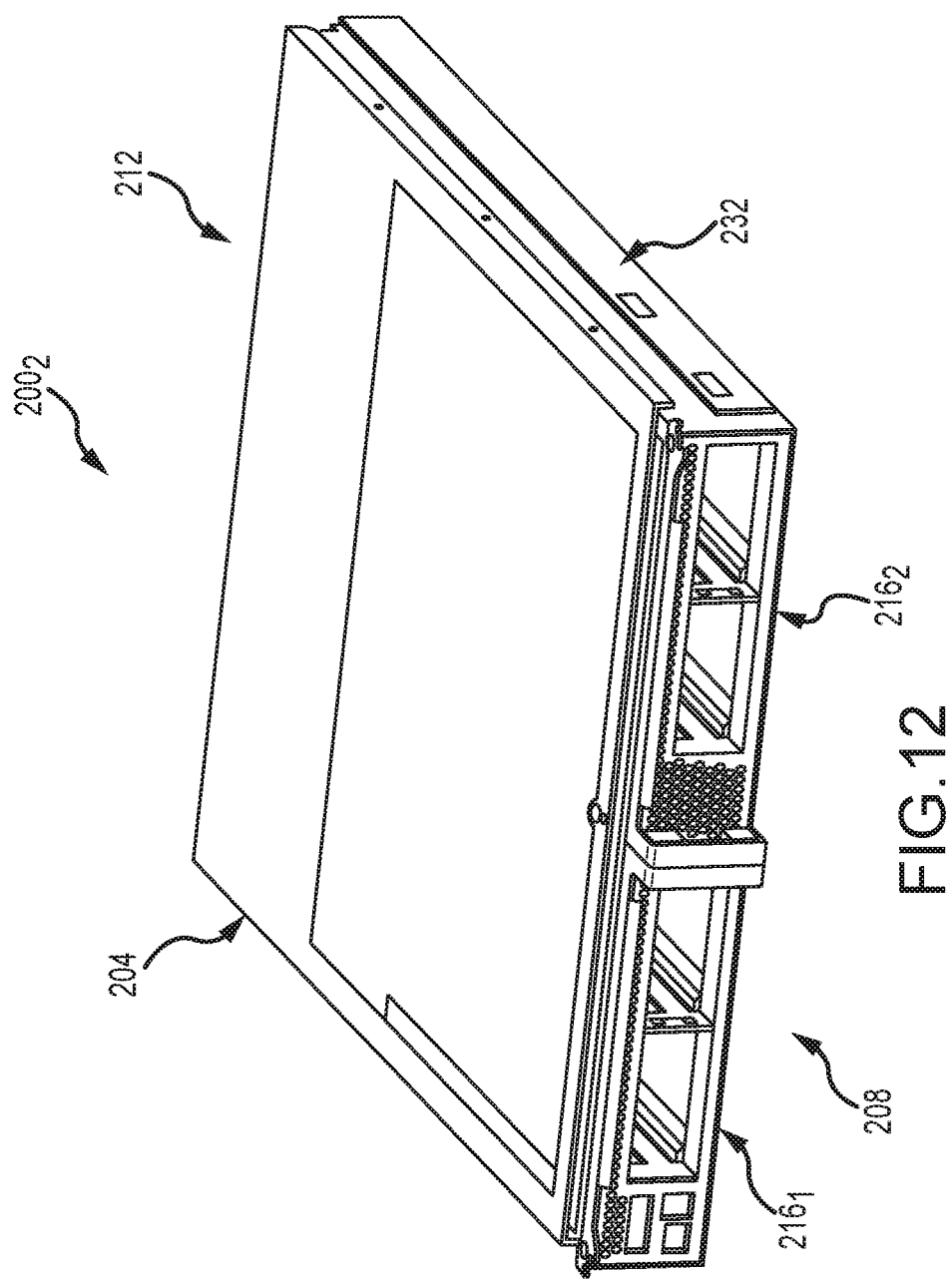
FIG. 12 is a front perspective view of the second computing module of FIG. 4.
Figure 13:
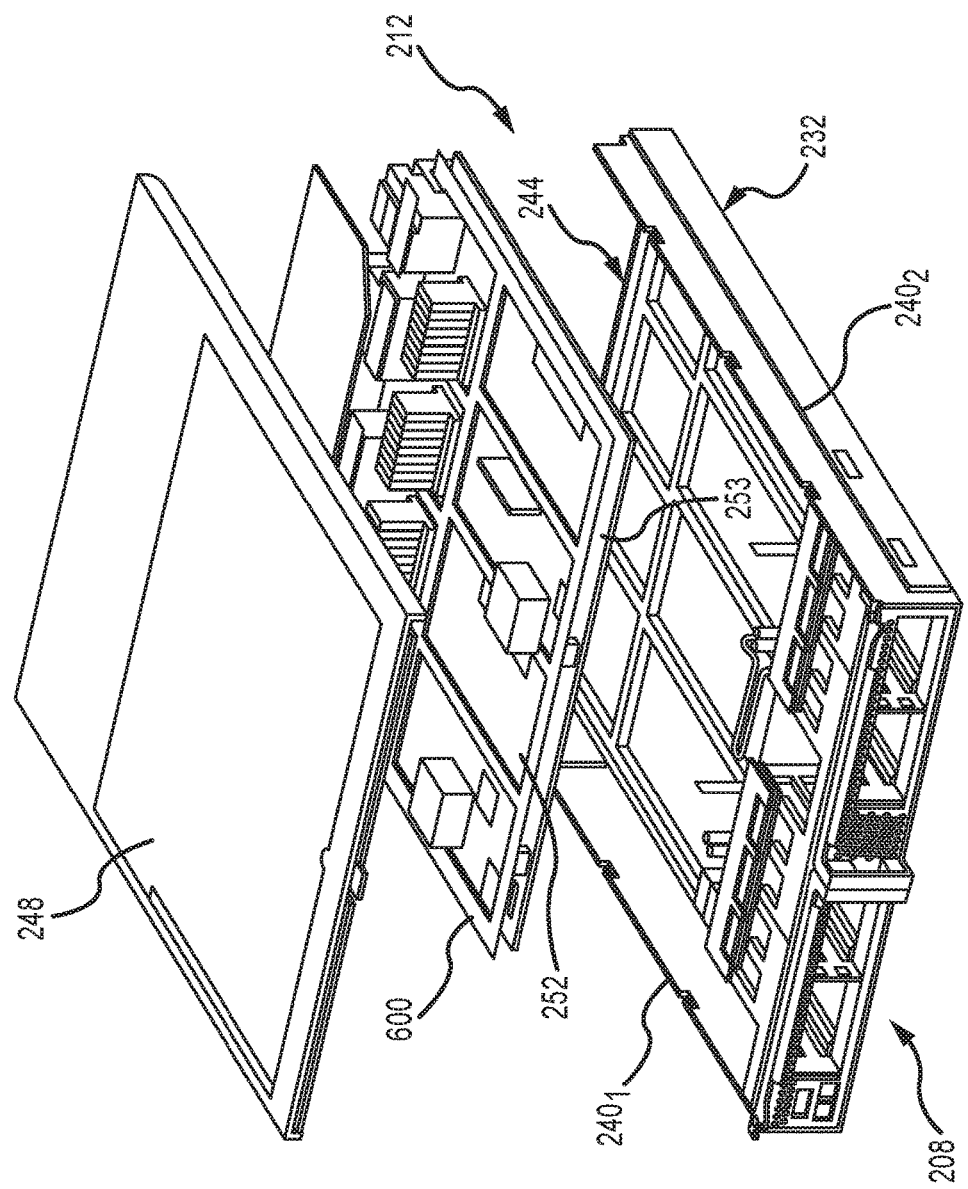
FIG. 13 is an exploded front perspective view of the second computing module of FIG. 4.
Figure 14:
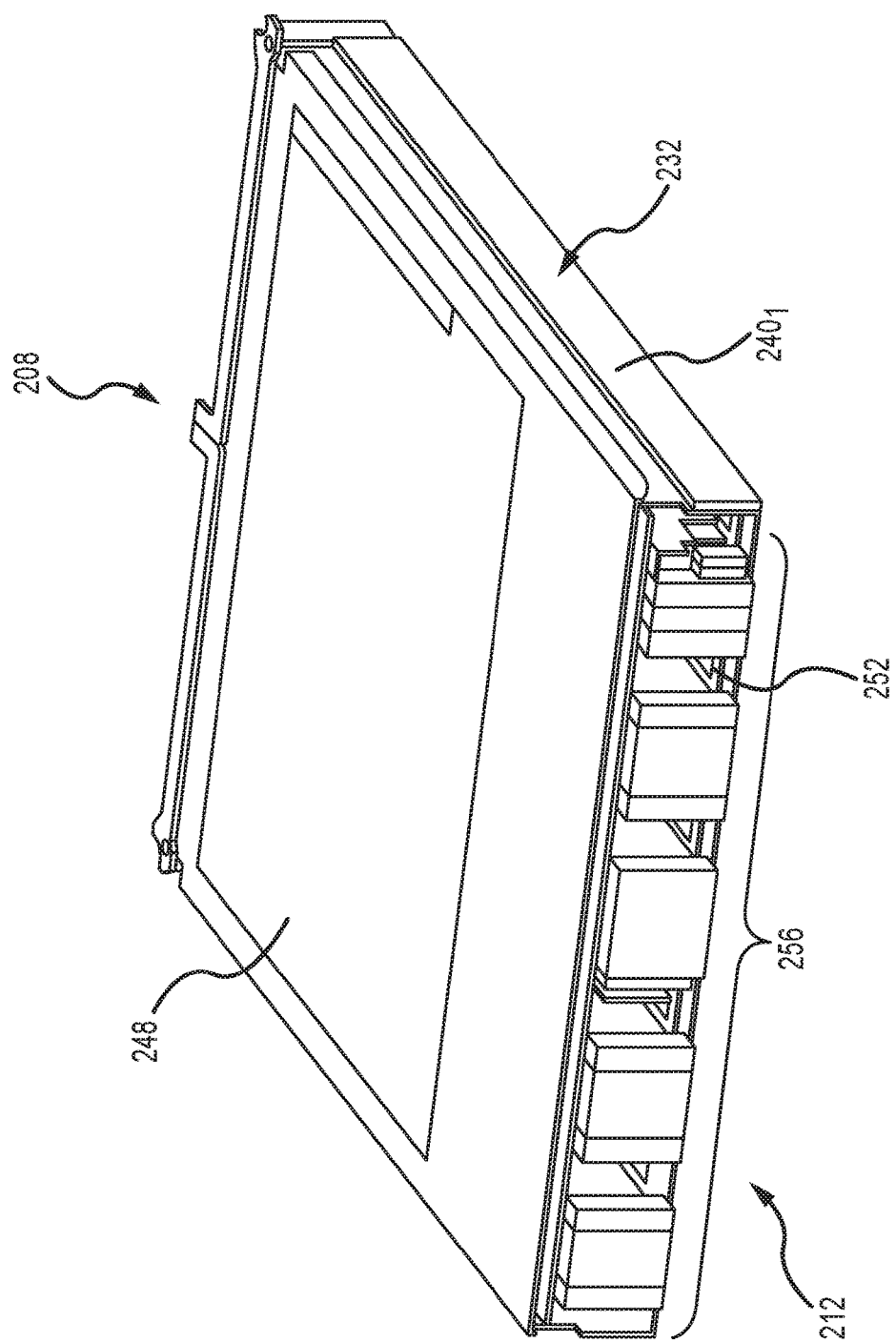
FIG. 14 is a rear perspective view of the second computing module of FIG. 4.
Figure 15:
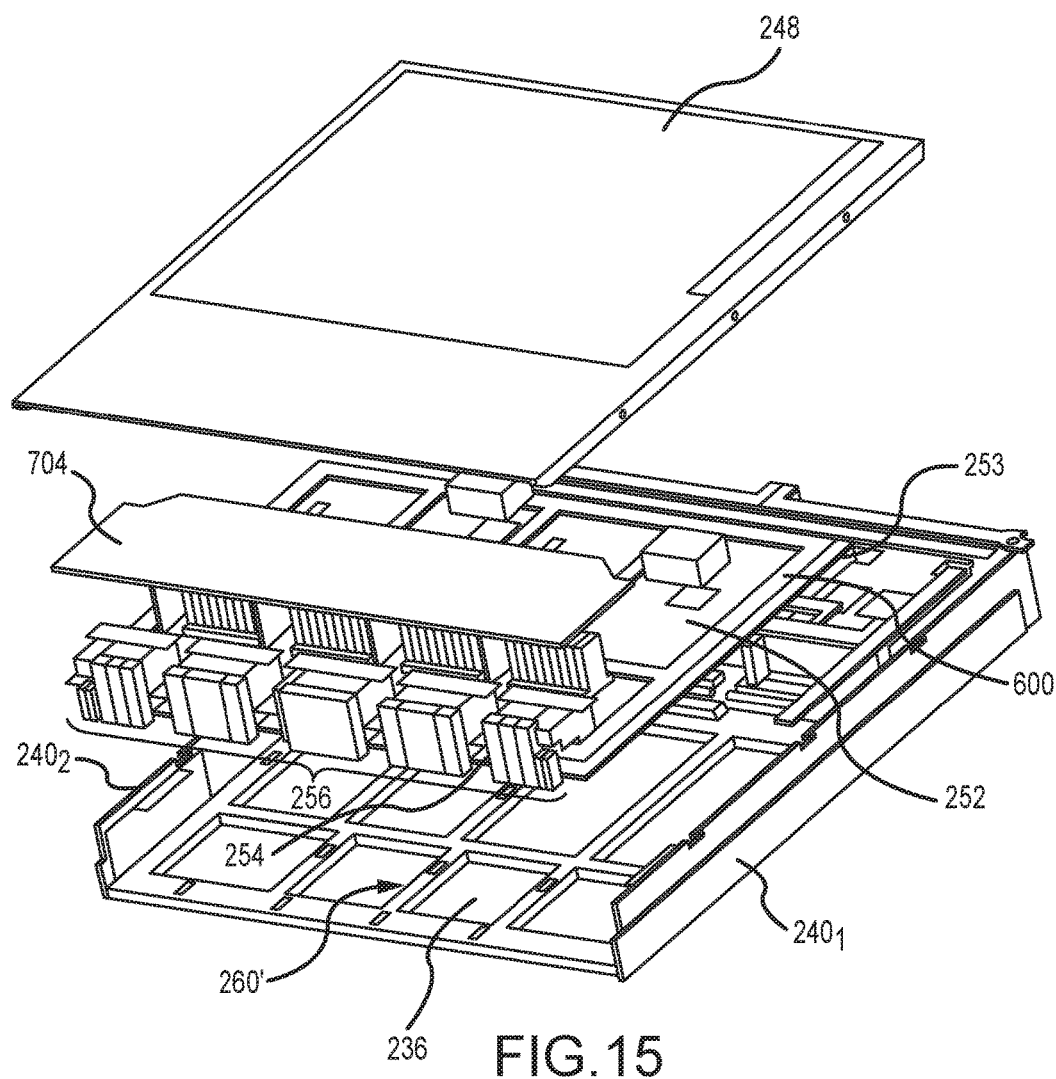
FIG. 15 is an exploded rear perspective view of the second computing module of FIG. 4.

In one embodiment, and with reference to FIGS. 9-11, the PCB 252 (with connectors 256 rigidly mounted thereto) may be rigidly mounted to a support frame 260 that is mounted to or over the base surface 236 of the chassis 204 for sliding movement in first and second opposite directions along the axis 272 in any appropriate manner. In other words, the PCB 252 and connectors 256 are mounted to be non-movable relative to the frame member 260 so that the support frame 260, PCB 252, and connectors 256 move along the axis 272 simultaneously. For instance, the support frame 260 may be in the form of a plurality of frame members 264 that are appropriately rigidly attached to each other (and thus non-movable relative to each other) and that are collectively configured to support the PCB 252 across a substantial entirety of a length and width of the PCB 252. The PCB 252 may be rigidly mounted or attached to the support frame 260 (e.g., so that the support frame 260 is disposed between the base surface 236 and the PCB 252) in any appropriate manner. As just one example, the support members 264 may include a plurality of apertures 268 therein that are configured to align with corresponding apertures (not labeled) in the PCB for receipt of any appropriate fasteners therethrough that are collectively configured to inhibit movement of the PCB 252 relative to the support frame 260 (PCB 252 not shown in FIGS. 9-11 in the interest of clarity). The support frame 260 may also take various other forms such as a plate, spaced members that are not attached to each other but that are nevertheless non-movable relative to each other, and/or the like.

The support frame 260 may be mounted for sliding movement in first and second directions along or parallel to the axis 272 in any appropriate manner. As just one example, the base surface 236 may include a plurality of protrusions 276 extending upwardly (e.g. perpendicularly) therefrom while the support frame 260 may include a plurality of corresponding slots 280 that are configured to receive the plurality of protrusions 276. A longitudinal axis of each of the slots 280 may be parallel to the axis 272 so that the respective pairs of protrusions 276 and slots 280 collectively guide sliding movement or translation of the support frame 260 (and PCB 252 and connectors 256 mounted thereto) along the axis 272. To facilitate mounting of the support frame 260 over the base surface 236 for sliding movement relative thereto along the axis 272, each slot 280 may be in the form of a keyhole having an enlarged opening 282 that is configured to receive an enlarged head 284 of the protrusion 276, as well as a narrowed portion 283 along which the enlarged head 284 is configured to slide.

Thus, the enlarged openings 282 of the support frame 260 may be initially aligned and pressed over the enlarged heads 284 of the protrusions of the base surface 236. The support frame may then be slid along the axis 272 towards the front portion 208 of the chassis 204 to bring the enlarged heads 284 into the narrowed portions 283 of the slots 280. See FIGS. 10-11. While the protrusions 276 are illustrated as being attached to or extending from the base surface 236 and the slots 280 are disposed in the support frame 260, the arrangement could be vice versa so that the protrusions 276 extend downwardly away from a bottom surface of the support frame 260 and the slots 280 are disposed in the base surface 236. Furthermore, various other manners of slidably attaching the support frame 260 to or relative to the base surface 236 are envisioned and encompassed herein.

With continued reference to FIGS. 9-11, the at least one biasing apparatus 500 (e.g., any appropriate spring member(s)) may in one embodiment be in the form of first and second biasing apparatuses $500_1$, $500_2$, each having at least one first portion 504 that is rigidly attached to or relative to the chassis 204 (so as to be non-movable relative to the chassis 204), at least one second portion 508 that is rigidly attached to or relative to the frame member 260 (so as to be non-movable relative to the frame member 260), and at least one third portion 512 (e.g., arm, member, etc.) between a respective pair of first and second portions 504, 508 that is configured to deflect as the connectors 256 of the PCB 252 engage with the connectors 312 of the backplane 300 when the chassis 204 is inserted into the socket 116 of the server enclosure 104 as discussed in more detail below. The first and second portions 504, 508 may be respectively rigidly attached to the base surface 236 and support frame 260 in any appropriate manner (e.g., one or more fasteners 516, 520 such as rivets or the like).

In one arrangement, each of the first and second biasing apparatuses $500_1$, $500_2$ may be in the form of a beam spring whereby the at least one third portion 512 is configured to bend in a plane generally parallel to the base surface 236 during engagement between the connectors 256 of the PCB 252 and the connectors 312 of the backplane 300. In the specific arrangement shown in FIG. 10, each of the first and second biasing apparatuses $500_1$, $500_2$ may include a pair of second portions 508 and a pair of third portions 512 that are disposed on opposite sides of the first portion 504. In this regard, each of the first and second biasing apparatuses $500_1$, $500_2$ may be in the form of first and second beam springs that extend in opposite directions (e.g., where the third portions 512 may extend generally perpendicularly to the axis 272).

In operation, the support frame 260 and PCB 252 (with connectors 256 rigidly attached to PCB 252 as discussed previously) may be slidably mounted within the base member 232 of the chassis 204 of a computing module 200 and the at least one biasing apparatus 500 may be interconnected between the chassis 204 and the support frame 260 as discussed above. For instance, the slots 280/protrusions 276 of the support frame 260 may be aligned with the slots 280/protrusions 276 of the base surface 236 and disposed thereover. Furthermore, the first portions 504 of the first and second biasing apparatuses $500_1$, $500_2$ may be rigidly secured to the base surface 236 and the second portions 508 of the first and second biasing apparatuses $500_1$, $500_2$ may be rigidly secured to the support frame 260 as discussed above or in other appropriate manners. The PCB 252 and connectors 256 may then be secured to the support frame 260. It is to be understood that the frame member 260, PCB 252 and connectors 256, and biasing apparatus(es) 500 may be secured and/or interconnected in an order different than that discussed above without departing from the scope of the present disclosure.

In any case, the cover 248 may then be secured over the base member 232 to contain the PCB 252 within the chassis 204 and the entire first computing module $200_1$ may be inserted into one of the sockets 116 of the server enclosure 104 along an axis 400 within the socket 116 (e.g., similar to how second computing module $200_2$ of FIG. 2 may be inserted into one of the sockets 116 along axis 400, where the connectors 156 of the PCB 252 are disposed adjacent the rear portion 212 and face away from the front portion 208 for interfacing with the connectors 312 of the backplane 300). Once the first computing module $200_1$ has been substantially inserted into the socket 116, the first and second levers $216_1$, $216_2$ (or other force generation apparatus) may be appropriately closed or otherwise manipulated as discussed previously to drive the connectors 256 of the PCB 252 into the connectors 312 of the backplane 300.

At some point before the ends of the male pins of one of the connectors 256 or connectors 312 reach the bottom of the female sockets of the other of the connectors 256 or connectors 312, friction between the male pins and female sockets urges the sliding frame 260, PCB 252 and connectors 256 along or parallel to the axis 272 towards the front portion 208 of the chassis 204 which deflects and compresses the first and second biasing apparatuses $500_1$, $500_2$. With reference to FIG. 10, for instance, the frame member 260 and second portions 508 of the first and second biasing apparatuses $500_1$, $500_2$ may be moved along the axis 272 towards the front portion 208 of the chassis 204 which deflects and bends the third portions 512 by a first amount (e.g., where the second and third portions 508, 512 slide over the base surface 236). Such deflection of the first and second biasing apparatuses $500_1$, $500_2$ generates an insertion force on the frame member 260 along or parallel to the axis 272 away from the front portion 208 that overcomes the friction between the male pins and female sockets of the connectors 256, 312 so that the ends of the male pins come to rest just flush at the bottom of the female sockets. This scenario may arise when the length of the chassis 204 (the distance between the front and rear portions 204, 208) is less than the length of the socket 116 (the distance between the front portion 120 of the server enclosure 104 and the PCB 308 of the backplane 300).

In the event the length of the chassis 204 (the distance between the front and rear portions 204, 208) is greater than the length of the socket 116 (the distance between the front portion 120 of the server enclosure 104 and the PCB 308 of the backplane 300) such that the backplane 300, PCB 252, and/or the like would otherwise be stressed or damaged, the biasing apparatus 500 (e.g., the first and second biasing apparatuses $500_1$, $500_2$) receives a reaction force from the backplane connectors 312 (via the support frame 260) and compresses or deflects by a second amount greater than the first amount towards the front portion 208 of the chassis which allows the PCB 252 and connectors 256 to move along the axis 272 relative to the chassis 204 towards the front portion 208 of the chassis 204. Various parameters of the biasing apparatus(es) 500, the support frame 260, etc. (e.g., such as spring constants, stiffnesses, dimensions, etc.) can be appropriately selected so that the male pins of one of the connectors 256, 312 just rest flush at the bottom of the female sockets of the other of the connectors 256, 312 under a wide range of mechanical tolerances in the lengths of the chassis 204 and the socket 116 free of bending of the PCBs 252, 308, damage to solder joints, and the like (e.g., based on the particular types of connectors 256, 312, the amount of insertion force generated by levers 216 or other insertion force generation apparatus, and the like).

FIGS. 12-15 present various views of a second computing module $200_2$ of the number of computing modules 200 of the server 100. Like the first computing module $200_1$, the second computing module $200_2$ may include a base member 232 (e.g., tray) having a base surface 236 with first and second opposite walls $240_1$, $240_2$ extending upwardly away from the base surface 236 and a cover member 248 that is configured to be disposed over the first and second opposite walls $240_1$, $240_2$ across the base surface 236 of the base member 232. The base member 232 and cover member 248 generally define an interior portion 244 for containing a PCB 252 (e.g., daughtercard) including a front portion 253 that is configured to be disposed adjacent the front portion 208 of the chassis 204, an opposite rear portion 254 that is configured to be disposed adjacent the rear portion 212 of the chassis 204, and any appropriate arrangement of electrical components (e.g., processors, memory, controllers, etc. interconnected by conductive traces).

A plurality of connectors 256 are electrically connected to the conductive traces of the PCB 252 adjacent the rear portion 252 of the PCB 252 for electrical interfacing (e.g., mating) with the corresponding plurality of connectors 312 of the backplane 300 adjacent the rear portion of a particular one of the sockets 116 of the server enclosure 104. The arrangement of electrical components on the PCB 252 as well as the dimensions of the PCB 252 of the second computing module $200_2$ may be the same as or different than that on the PCB 252 of the first computing module $200_1$. Furthermore, the connectors 256 on the PCB 252 of the second computing module $200_2$ may be the same as or different than those on the PCB 252 of the first computing module $200_1$ (e.g., so long as they are configured to interface with the connectors 312 of the backplane 300 at the rear of the particular socket 116 into which the second computing module $200_2$ is to be inserted). In one arrangement, a apparatus 600 (e.g., plate, frame) may be appropriately secured over a top of the PCB 252 for use in insulating and/or increasing the rigidity thereof.

Figure 16:
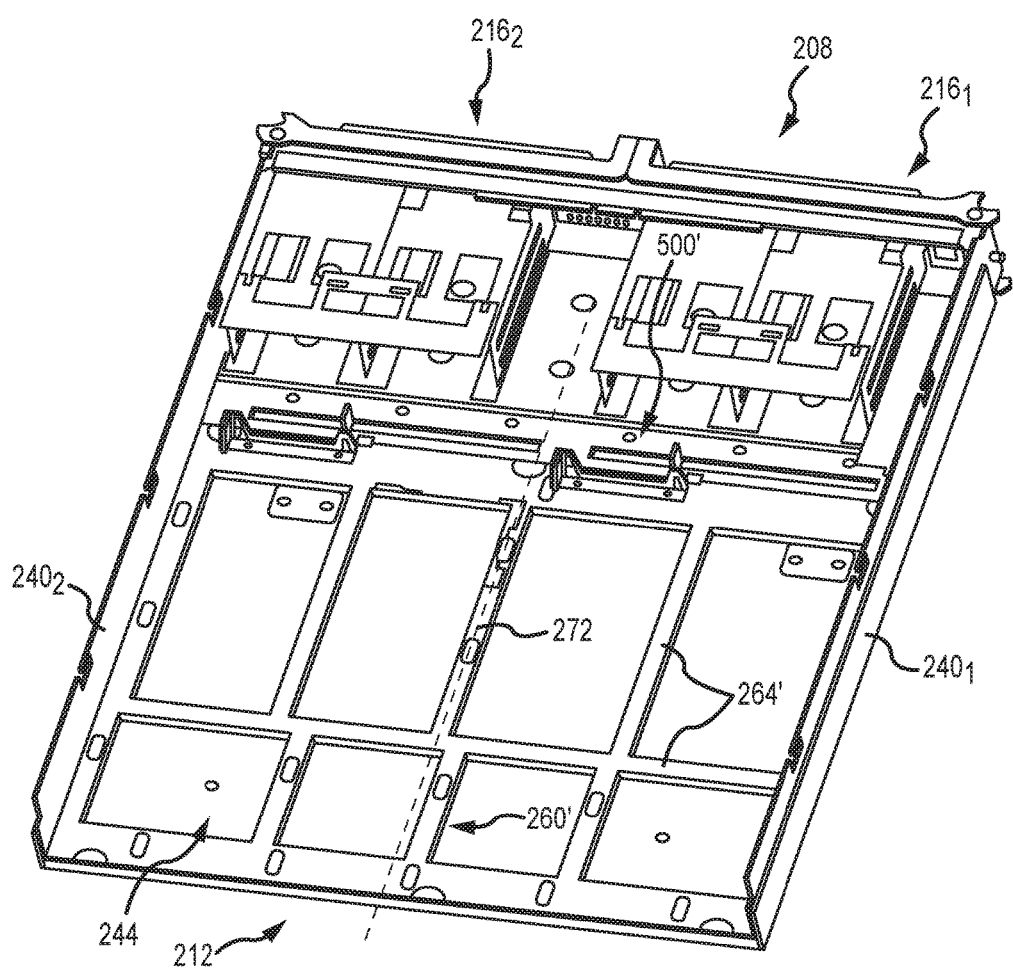
FIG. 16 is a rear perspective view of the second computing module of FIG. 4 with a top cover and PCB being removed to illustrate a sliding frame and biasing apparatus.
Figure 17:
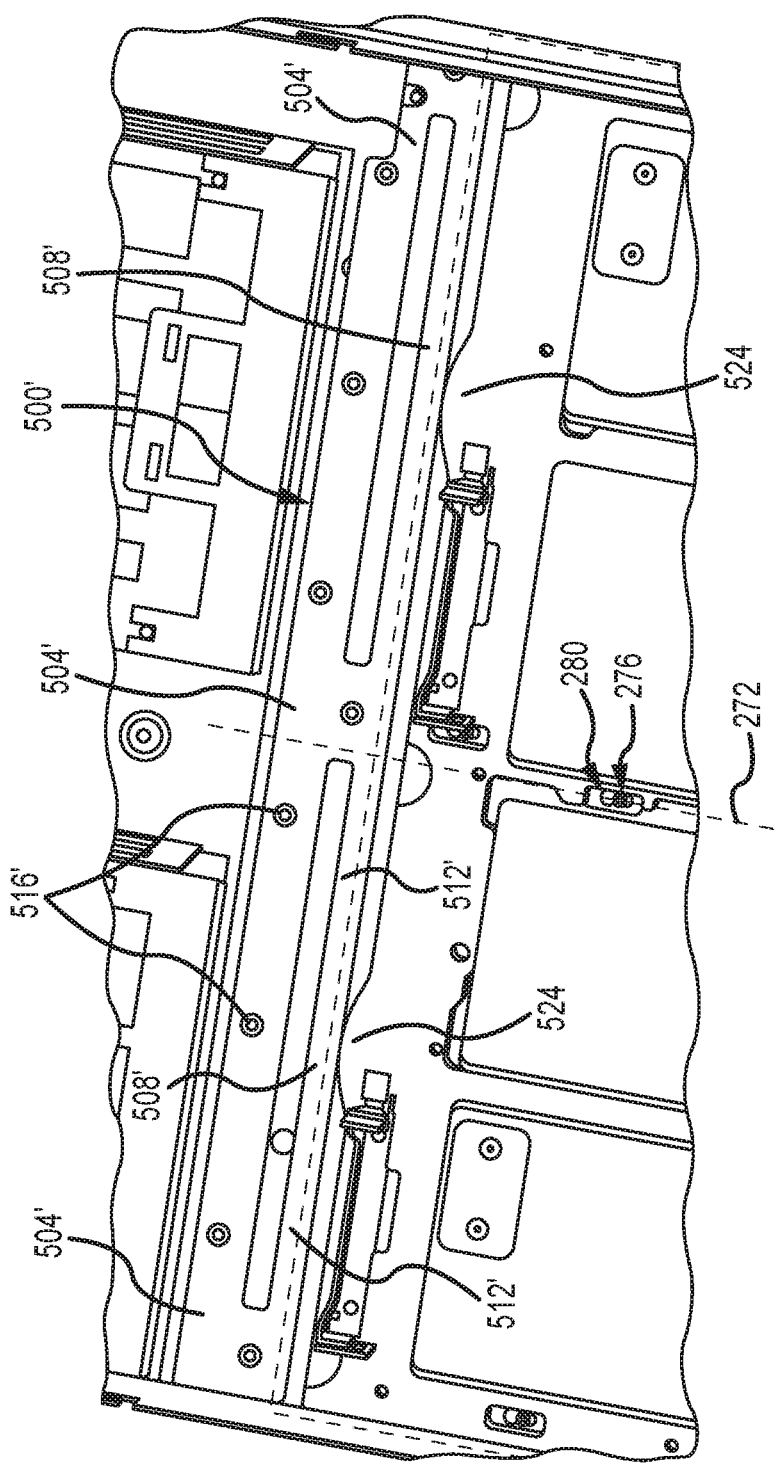
FIG. 17 is a close-up perspective view of the sliding frame and biasing apparatus of FIG. 16.
Figure 18:
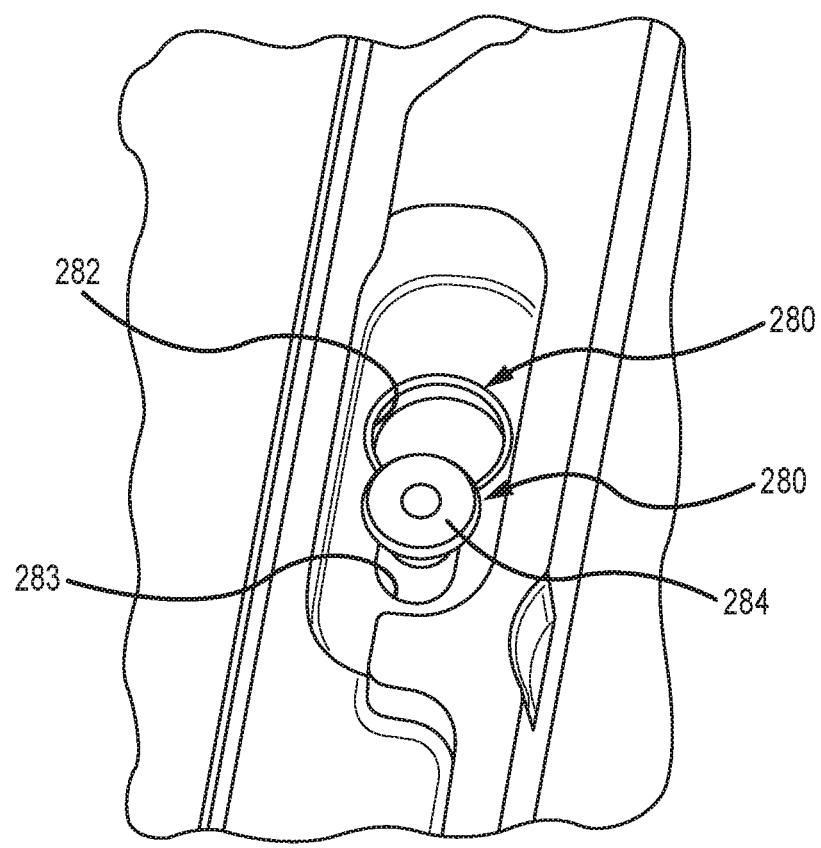
FIG. 18 is a close-up perspective view of a portion of the sliding frame of FIG. 17.
Figure 19:
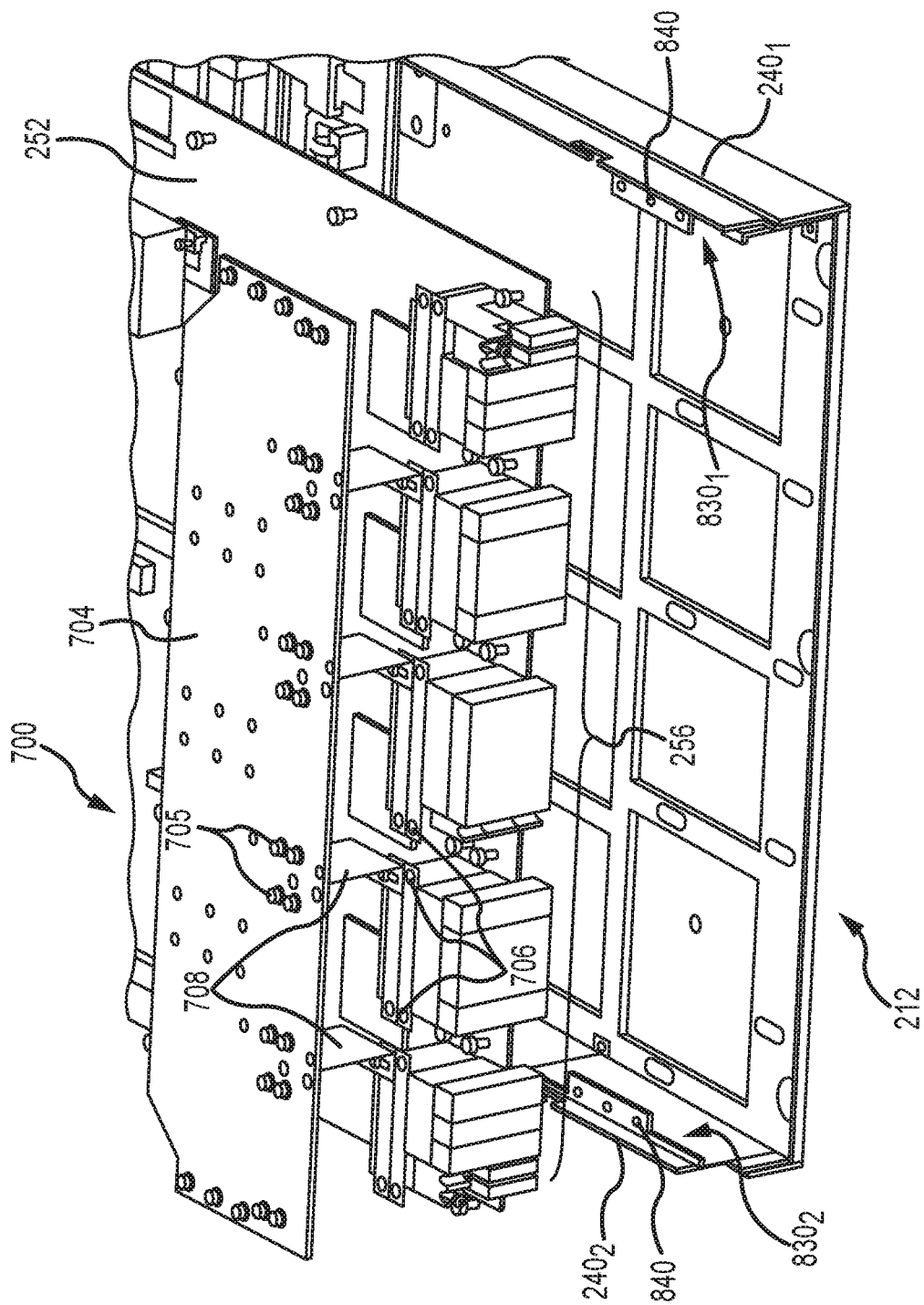
FIG. 19 is a close-up perspective view of the rear portion of the second computing module of FIG. 4 and illustrating a stiffening system for rigidly interconnecting the plurality of connectors.
Figure 20:
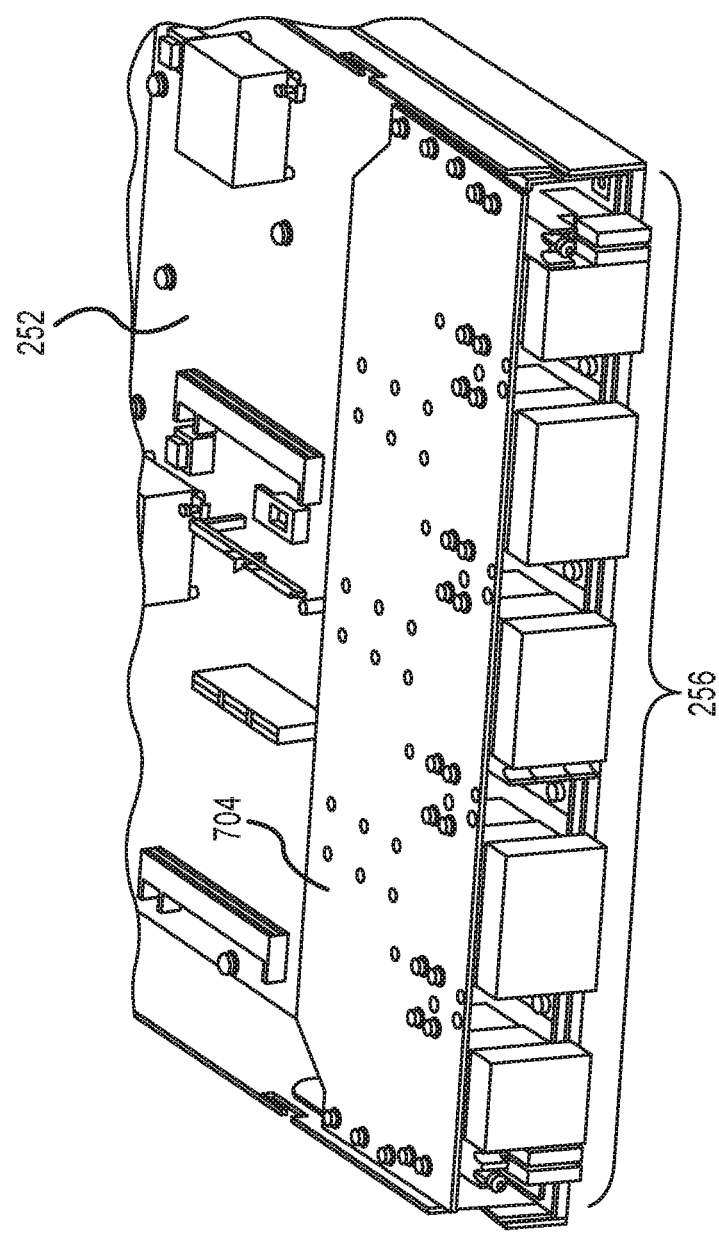
FIG. 20 is a perspective view similar to FIG. 19 but with the stiffening buttress interconnected to the plurality of connectors.

With additional reference now to FIGS. 16-18, the PCB 252 (with connectors 256 rigidly mounted thereto) may be rigidly mounted to a support frame 260' that is mounted to or over the base surface 236 of the chassis 204 for sliding movement in first and second opposite directions along the axis 272 in any appropriate manner. For instance, the support frame 260' may be in the form of a plurality of frame members 264 that are appropriately rigidly attached to each other (and thus non-movable relative to each other) and that are collectively configured to support the PCB 252 across a substantial entirety of a length and width of the PCB 252. The PCB 252 may be rigidly mounted or attached to the support frame 260' (e.g., so that the support frame 260 is disposed between the base surface 236 and the PCB 252) in any appropriate manner (e.g. via apertures (not labeled) in the support frame 260'). The support frame 260' may also take various other forms such as a plate, spaced members that are not attached to each other but that are nevertheless non-movable relative to each other, and/or the like. The support frame 260' may be mounted for sliding movement in first and second directions along or parallel to the axis 272 such as via protrusions 276 and slots 280 as discussed in relation to the support frame 260 of the first computing module $200_1$ or in other appropriate manners.

The at least one biasing apparatus 500' (e.g., any appropriate spring member(s)) may have one or more first portions 504' that are rigidly attached to or relative to the chassis 204 (so as to be non-movable relative to the chassis 204, such as via fasteners/rivets 516' or the like), one or more second portions 508' that are in contact with the frame member 260'), and one or more third portions 512' (e.g., arms, members, etc.) disposed between respective pairs of first and second portions 504', 508' that are configured to deflect as the connectors 256 of the PCB 252 engage with the connectors 312 of the backplane 300 when the chassis 204 is inserted into the socket 116 of the server enclosure 104. For instance, the second and third portions 508', 512' may be configured to bend or deflect in a plane generally parallel to the base surface 236 during engagement between the connectors 256 of the PCB 252 and the connectors 312 of the backplane 300. In one arrangement, the support frame 260' and/or the second portions 508' of the biasing apparatus 500' may include one or more force concentration portions 524 to facilitate bending (e.g., flexing, deflection) of the second and third portions 508', 512'. As shown in FIG. 17, for instance, the force concentration portions 524 may be in the form of protrusions (e.g., bumps) extending away from a top edge of the support frame 260' towards the second portions 508' for contact therewith.

In operation, the support frame 260', PCB 252 and biasing apparatus 500' of the second computing module $200_2$ may be interconnected into the chassis 204 in any appropriate manner consistent with the above discussion and the cover 248 may be secured over the base member 232 to contain the PCB 252 within the chassis 204. The entire second computing module $200_2$ may be inserted into one of the sockets 116 of the server enclosure 104 along an axis 400 within the socket 116 (e.g., see second computing module $200_2$ in FIG. 2). Once the second computing module $200_2$ has been substantially inserted into the socket 116, the first and second levers $216_1$, $216_2$ (or other force generation apparatus) may be appropriately closed or otherwise manipulated as discussed previously to drive the connectors 256 of the PCB 252 into the connectors 312 of the backplane 300.

At some point before the ends of the male pins of one of the connectors 256 or connectors 312 reach the bottom of the female sockets of the other of the connectors 256 or connectors 312, friction between the male pins and female sockets urges the support frame 260', PCB 252 and connectors 256 along or parallel to the axis 272 towards the front portion 208 of the chassis 204 which deflects and compresses the biasing apparatus first and second portions 508', 512' of the biasing apparatus 500' by a first amount. Such deflection of the biasing apparatuses 500' generates an insertion force on the frame member 260' along or parallel to the axis 272 away from the front portion 208 that overcomes the friction between the male pins and female sockets of the connectors 256, 312 so that the ends of the male pins come to rest just flush at the bottom of the female sockets. This scenario may arise when the length of the chassis 204 (the distance between the front and rear portions 204, 208) is less than the length of the socket 116 (the distance between the front portion 120 of the server enclosure 104 and the PCB 308 of the backplane 300).

In the event the length of the chassis 204 (the distance between the front and rear portions 204, 208) is greater than the length of the socket 116 (the distance between the front portion 120 of the server enclosure 104 and the PCB 308 of the backplane 300) such that the backplane 300, PCB 252, and/or the like would otherwise be stressed or damaged, the biasing apparatus 500' (the second portions 508') receives a reaction force from the backplane connectors 312 (via the support frame 260') and compresses or deflects by a second amount greater than the first amount which allows the PCB 252 and connectors 256 to move along the axis 272 relative to the chassis 204 towards the front portion 208 of the chassis 204. Various parameters of the biasing apparatus 500', the support frame 260', etc. (e.g., such as spring constants, stiffnesses, dimensions, etc.) can be appropriately selected so that the male pins of one of the connectors 256, 312 just rest flush at the bottom of the female sockets of the other of the connectors 256, 312 under a wide range of mechanical tolerances in the lengths of the chassis 204 and the socket 116 free of bending of the PCBs 252, 308, damage to solder joints, and the like (e.g., based on the particular types of connectors 256, 312, the amount of insertion force generated by levers 216 or other insertion force generation apparatus, and the like).

In some situations, the insertion force generated by the levers 216 or other insertion force generation apparatus may be above or below a center height of the connectors 256 on the PCB 252 of one of the computing modules 200. As a result, bending moments may occur which can rock the connectors 256 back from the corresponding connectors 312 of the backplane 300 and thus inhibit full mating between the respective pairs of connectors 256, 312. For instance, the respective pairs of connectors 256, 312 may be fully mated at the bottom thereof while a gap may exist at the top thereof.

In this regard, and turning now to FIGS. 19-22, one or more of the computing modules 200 may include connector stiffening system 700 that is configured to resist the above-discussed bending moments that may otherwise occur due to discrepancies in the height of the generated insertion force and the center heights of the connectors 256. Broadly, the stiffening system 700 includes a stiffening plate 704 that is configured to be rigidly attached to and to interconnect the plurality of connectors 256 on the PCB 252. For instance, the stiffening plate 704 may be disposed over a top of the connectors 256 (e.g., such that the connectors 256 are disposed between the stiffening plate 704 and the PCB 252) and the stiffening plate 704 may be rigidly (e.g., non-movably) attached to the connectors 256 in any appropriate manner (e.g., such as via inserting fasteners 705 through apertures (not shown) in the stiffening plate 704 and through corresponding aligned apertures 706 in or attached to the connectors 256).

The stiffening system 700 may also include a plurality of first stiffening members 708 that interconnect the stiffening plate 704 to the PCB 252 (or at least so as to be non-movable relative to the PCB 252) and a plurality of second stiffening members 712 that interconnect the stiffening plate 704 to the PCB 252 (or at least so as to be non-movable relative to the PCB 252). The first stiffening members 708 (e.g., brackets, beams, or other rigid pieces of material) may include a first portion 709 that is rigidly (non-movably) attached to the stiffening plate 704 in any appropriate manner (e.g., fasteners and aligned apertures) and an opposite second portion 710 that is rigidly (non-movably) attached to the PCB 252 or relative to the PCB 252 (e.g., to stiffening apparatus 600, see FIGS. 13 and 15) in any appropriate manner (e.g., fasteners and aligned apertures). For instance, the first stiffening members 708 may be disposed between adjacent connectors 256 in a manner that allows airflow therethrough into fans of the server 100.

The second stiffening members 712 (e.g., brackets, beams, or other rigid pieces of material) may include a first portion 713 that is rigidly (non-movably) attached to the stiffening plate 704 in any appropriate manner (e.g., fasteners and aligned apertures) and an opposite second portion 714 that is rigidly (non-movably) attached to the PCB 252 or relative to the PCB 252 (e.g., to stiffening apparatus 600, see FIGS. 13 and 15) in any appropriate manner (e.g., fasteners and aligned apertures). For instance, the second stiffening members 712 may be disposed between the connectors 256 and the front portion 208 of the chassis 204 or in other words between the connectors 256 and the location from where the insertion force is being generated and applied.

Figure 21:
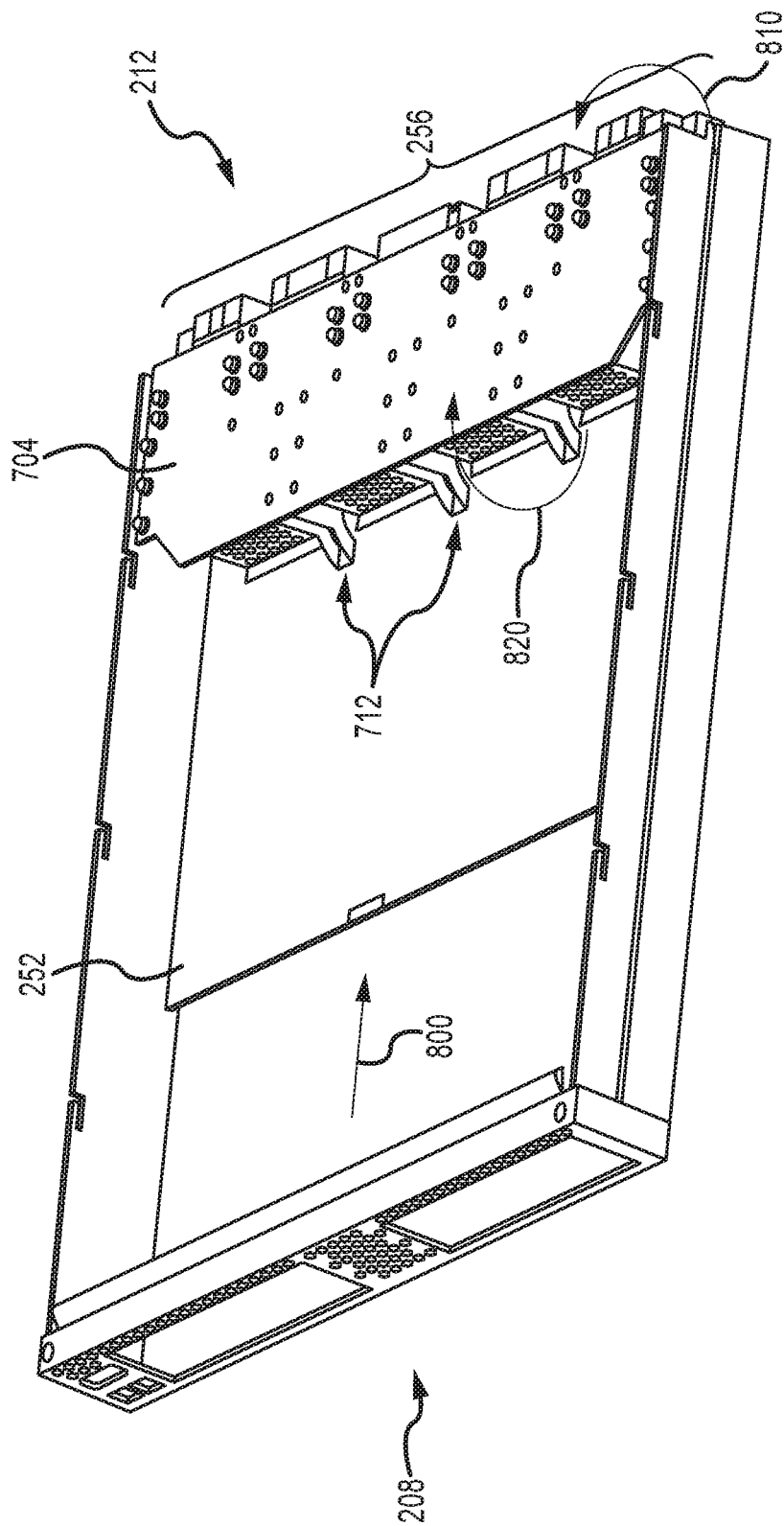
FIG. 21 is another perspective view similar to FIG. 20 but including a plurality of beam members interconnecting the stiffening buttress to the PCB.
Figure 22:
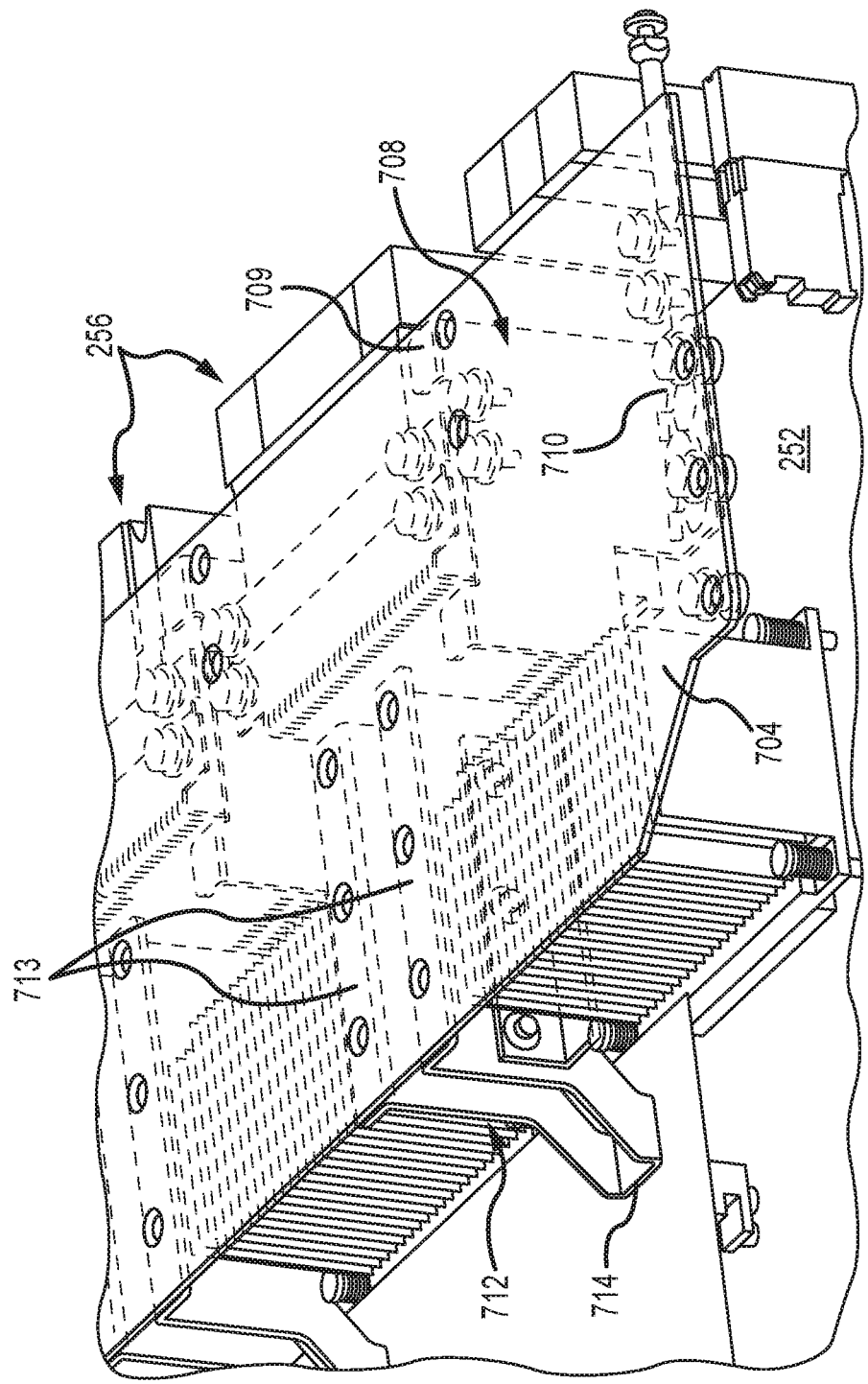
FIG. 22 is a close-up perspective view of a portion of FIG. 21.

With reference to FIGS. 21-22, an insertion force 800 (e.g., generated by levers 216 or other insertion force generation apparatus) may be directed along or parallel to axes 400, 272 (see FIGS. 2 and 16) for mating the connectors 256 on the PCB 252 with the connectors 312 of the backplane 300. As discussed above, the insertion force 800 can sometimes induce bending moments in the connectors 256 as the connectors 256 mate with the connectors 312 of the backplane 300 which can create gaps at the top or bottom of the connectors 256, 312 and thereby reduce signal quality through the connectors 256, 312. In the event that the insertion force 800 is disposed at a height lower than the center height of the connectors 256 (as measured from the PCB 252), the insertion force 800 can generate a bending moment 810 in the connectors 256 that tends to move the tops of the connectors 256 in a counterclockwise direction and thereby separate the tops of the connectors 256 from the tops of the corresponding connectors 312 creating a gap therebetween.

In this regard, the stiffening system 700 is configured to resist or even prevent or limit bending moments from being induced in the connectors 256 that would otherwise prevent or limit the connectors 256 from fulling mating with the connectors 312 (i.e., from the top to the bottom of the connectors 256, 312, e.g., such that the ends of all of the male pins just rest at the bottom of all of the corresponding female sockets). For instance, the stiffening plate 704 and the second stiffening members 712 may be configured resist the bending moment 810 by providing an opposing reaction force 820 that is at least equal to the bending moment to prevent or limit the tops of the connectors 256 from pulling away from the tops of the connectors 312. In other words, the stiffening plate 704 and the second stiffening members 708 may transmit connector insertion forces from the tops of the connectors 256 to the PCB 252 (or to the stiffening apparatus 600).

In one arrangement, first and second attachment structures $830_1$, $830_2$ may be rigidly attached to the support frame 260' adjacent the first and second walls $240_1$, $240_2$ of the chassis 204 (so as to be non-movable relative to the support frame 260' and movable relative to the first and second walls $240_1$, $240_2$) for connection with the stiffening plate 704. For instance, each of the first and second attachment structures $830_1$, $830_2$ may include one or more apertures 840 that are configured to align with corresponding apertures (not labeled) in the stiffening plate 704 for receipt of fasteners 850 therethrough.

It will be readily appreciated that many additions and/or deviations may be made from the specific embodiments disclosed in the specification without departing from the spirit and scope of the invention. The illustrations and discussion herein has only been provided to assist the reader in understanding the various aspects of the present disclosure. For instance, a server 100 may include a plurality of first computing modules $200_1$ and/or a plurality of second computing modules $200_2$ for receipt into respective sockets 116 of the server enclosure 104.

Furthermore, one or more various combinations of the above discussed arrangements and embodiments are also envisioned. For instance, the support frame 260 and biasing apparatus(es) 500 discussed in relation to the first computing module $200_1$ may be used in the second computing module $200_2$ while the support frame 260' and biasing apparatus 500' discussed in relation to the second computing module $200_2$ may be used in the first computing module $200_1$.

While this specification contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

We claim:

1. A module for slidable receipt in an electronics enclosure, comprising:
    a chassis including opposite front and rear portions, opposite first and second side portions, and an interior portion;
    a printed circuit board (PCB) mounted within the interior portion of the chassis for sliding movement relative to the chassis along a first axis that extends from the front portion to the rear portion between the first and second side portions of the chassis;
    at least a first connector electrically connected to the PCB adjacent the rear portion of the chassis; and
    a biasing apparatus interconnected between the chassis and the PCB that is configured to deflect upon engagement between the first connector and a corresponding second connector secured within the electronics enclosure in response to the chassis being inserted into a socket of the electronics enclosure along a second axis that is parallel to the first axis.

2. The module of claim 1, wherein the chassis further includes a bottom portion, and wherein the PCB is slidable over the bottom portion of the chassis along the axis.

3. The module of claim 2, further including:
a frame that is slidably attached to the bottom portion of the chassis for sliding movement along the first axis, wherein the PCB is rigidly attached to the frame for movement therewith along the first axis.

4. The module of claim 3, wherein one of the frame and the chassis includes a plurality of protrusions, and wherein the other of the frame and the chassis includes a plurality of slots that configured to receive the plurality of protrusions to guide sliding of the frame and PCB along the first axis.

5. The module of claim 3, wherein the biasing apparatus includes at least first and second portions, wherein the first portion is rigidly secured to the chassis and is non-movable relative to the chassis, and wherein the second portion is in contact with the frame.

6. The module of claim 5, wherein the second portion is rigidly secured to the frame and is non-movable relative to the frame, and wherein the biasing apparatus includes a third portion between the first and second portions that is configured to deflect upon engagement between the first and second connectors as the chassis is inserted into the socket of the electronics enclosure.

7. The module of claim 1, wherein the biasing apparatus is a beam spring that is configured to deflect within a plane that is parallel to the bottom portion of the chassis.

8. The module of claim 1, further including:
a lever arm pivotally attached to the chassis for urging the chassis towards the second connector secured within the electronics enclosure.

9. The module of claim 3, wherein the biasing apparatus includes at least first and second portions, wherein the first portion is rigidly secured to the chassis and is non-movable relative to the chassis, wherein the second portion of the biasing apparatus is movable relative to the first portion of the biasing apparatus, and wherein the frame includes a force concentration portion that is configured to contact and deflect the second portion of the biasing apparatus upon engagement between the first and second connectors as the chassis is inserted into the socket of the electronics enclosure along the second axis.

10. The module of claim 9, wherein the force concentration portion is a protrusion extending away from a top edge of the frame towards the second portion of the biasing apparatus.

11. A module for slidable receipt in an electronics enclosure, comprising:
a chassis including opposite front and rear portions, opposite first and second side portions, and an interior portion;
a printed circuit board (PCB) mounted within the interior portion of the chassis for sliding movement along an axis that extends from the front portion to the rear portion between the first and second side portions of the chassis;
at least a first connector electrically connected to the PCB adjacent the rear portion of the chassis; and
a biasing apparatus interconnected between the chassis and the PCB that is configured to deflect upon engagement between the at least one connector and a corresponding second connector secured within the electronics enclosure as the chassis is inserted into a socket of the electronics enclosure, wherein the at least one connector is a plurality of connectors electrically attached to the PCB, and wherein the module further includes:
a stiffening plate interconnecting the plurality of connectors; and
a plurality of stiffening members interconnecting the stiffening plate to the PCB, wherein the stiffening plate and the plurality of stiffening members are configured resist bending moments induced in the plurality of connectors as the module is inserted into the socket of the electronics enclosure.

* * * * *

UNITED STATES PATENT AND TRADEMARK OFFICE
CERTIFICATE OF CORRECTION

PATENT NO. : 10,111,356 B2
APPLICATION NO. : 15/086386
DATED : October 23, 2018
INVENTOR(S) : Lindquist et al.

Page 1 of 1

It is certified that error appears in the above-identified patent and that said Letters Patent is hereby corrected as shown below:

In the Claims

In Column 16, Line 22, in Claim 11, delete "a first" and insert -- one --, therefor.

Signed and Sealed this
Thirty-first Day of December, 2019

Andrei Iancu
*Director of the United States Patent and Trademark Office*